(12) United States Patent
Okimoto et al.

(10) Patent No.: US 11,409,049 B2
(45) Date of Patent: Aug. 9, 2022

(54) MEMS ELEMENT AND OPTICAL APPARATUS USING THE SAME

(71) Applicant: SUMITOMO PRECISION PRODUCTS CO., LTD., Hyogo (JP)

(72) Inventors: Naoki Okimoto, Hyogo (JP); Mario Kiuchi, Hyogo (JP); Ryohei Uchino, Hyogo (JP)

(73) Assignee: SUMITOMO PRECISION PRODUCTS CO., LTD., Hyogo (JP)

( * ) Notice: Subject to any disclaimer, the term of this patent is extended or adjusted under 35 U.S.C. 154(b) by 582 days.

(21) Appl. No.: 16/493,249

(22) PCT Filed: Mar. 8, 2018

(86) PCT No.: PCT/JP2018/009084
§ 371 (c)(1),
(2) Date: Sep. 11, 2019

(87) PCT Pub. No.: WO2018/168660
PCT Pub. Date: Sep. 20, 2018

(65) Prior Publication Data
US 2020/0116942 A1 Apr. 16, 2020

(30) Foreign Application Priority Data
Mar. 17, 2017 (JP) .............................. JP2017-052014

(51) Int. Cl.
*G02B 26/08* (2006.01)
*G02B 6/35* (2006.01)
(Continued)

(52) U.S. Cl.
CPC .......... *G02B 6/3584* (2013.01); *B81B 3/0051* (2013.01); *B81B 3/0083* (2013.01);
(Continued)

(58) Field of Classification Search
CPC .... G02B 6/3584; G02B 6/3596; G02B 26/02; G02B 26/023; G02B 26/0833; G02B 6/353; G02B 6/3576
See application file for complete search history.

(56) References Cited

U.S. PATENT DOCUMENTS 7,298,954 B2 11/2007 Liu
2002/0191267 A1* 12/2002 Flanders ............... B81B 3/0021
359/254

OTHER PUBLICATIONS

International Search Report for corresponding Application No. PCT/JP2018/009084, dated Jun. 5, 2018.

* cited by examiner

*Primary Examiner* — Joseph P Martinez
(74) *Attorney, Agent, or Firm* — Renner, Otto, Boisselle & Sklar, LLP

(57) ABSTRACT

A MEMS element includes a substrate, a fixing portion provided at the substrate, first and second actuators provided at the fixing portion, a drive target member coupled to the first and second actuators, a third actuator provided at the fixing portion, and a restriction member coupled to the third actuator. The first and second actuators drive the drive target member in a direction parallel to or crossing an upper surface of the substrate. The third actuator drives the restriction member in a direction crossing a movement direction of the drive target member to position the restriction member within a movement plane of the drive target member such that the restriction member restricts displacement of the drive target member.

20 Claims, 24 Drawing Sheets

(51) Int. Cl.
 *B81B 3/00* (2006.01)
 *G02B 26/02* (2006.01)
(52) U.S. Cl.
 CPC ......... *G02B 6/3596* (2013.01); *G02B 26/023* (2013.01); *G02B 26/0833* (2013.01)

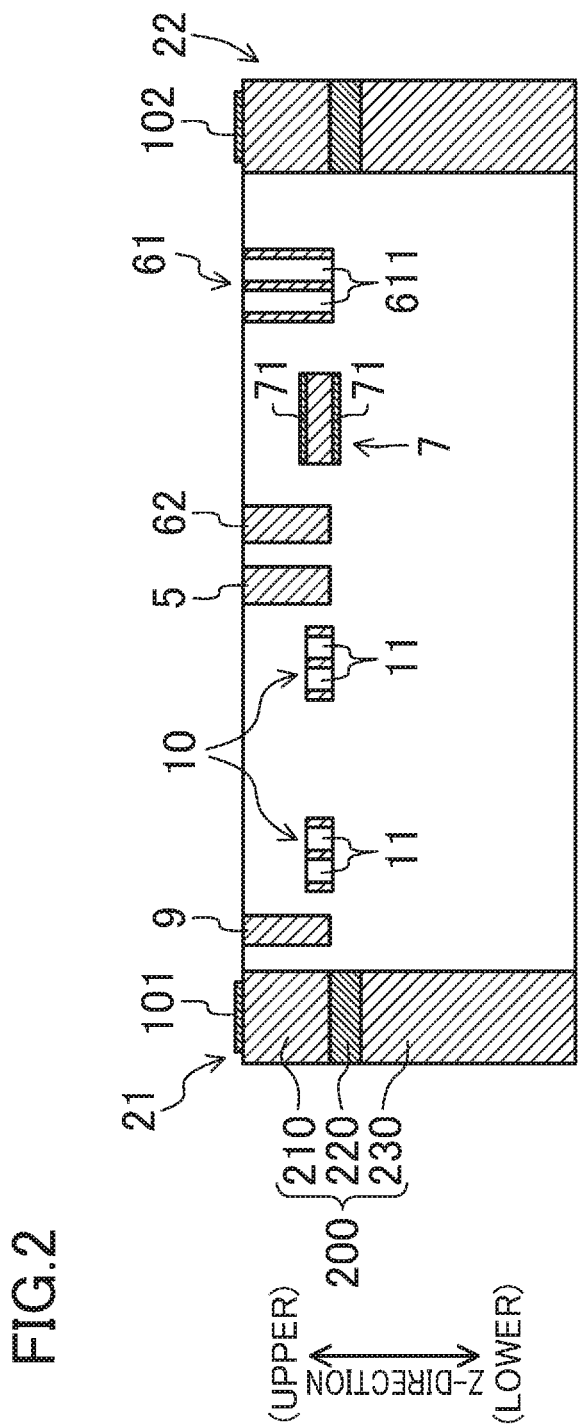

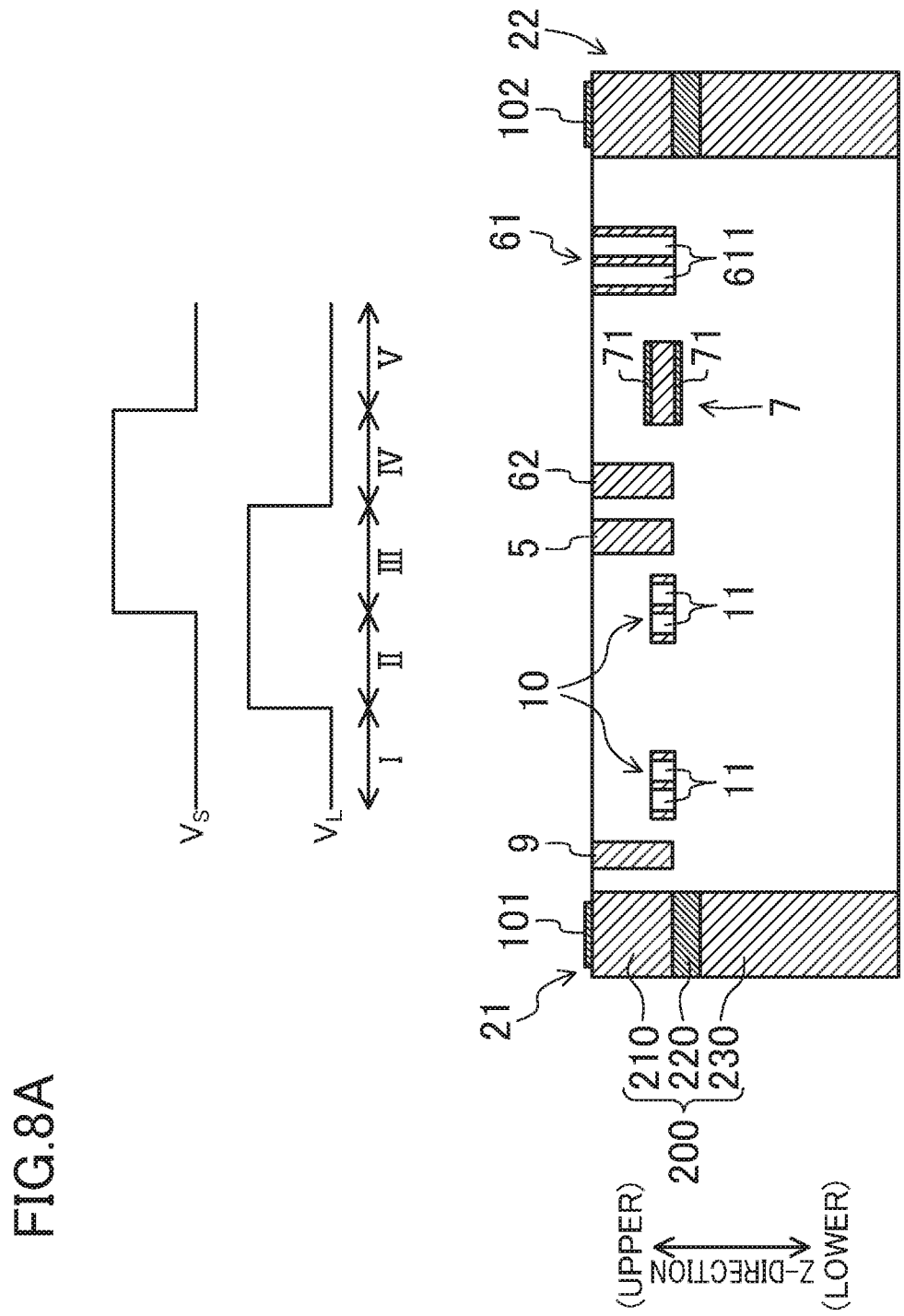

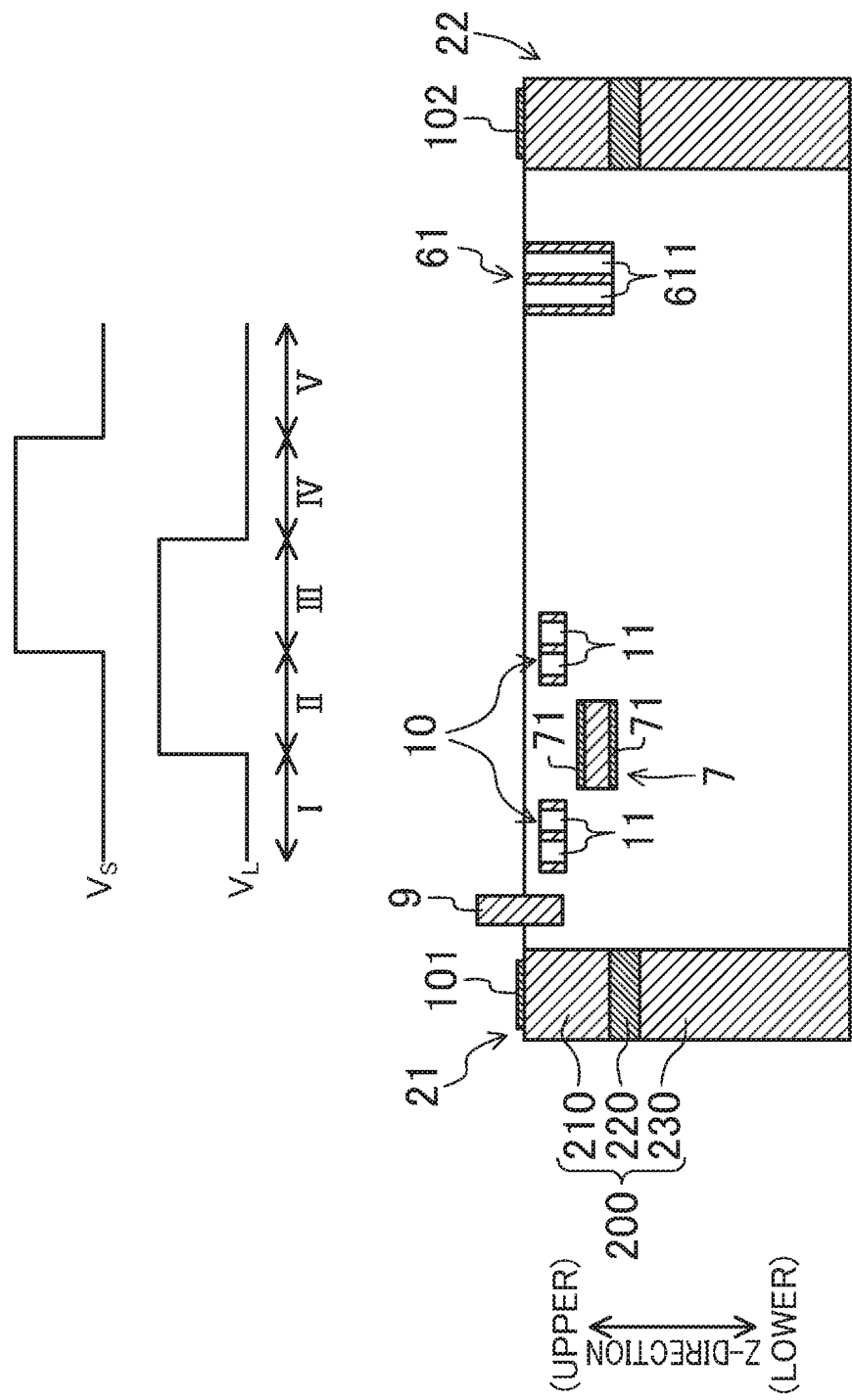

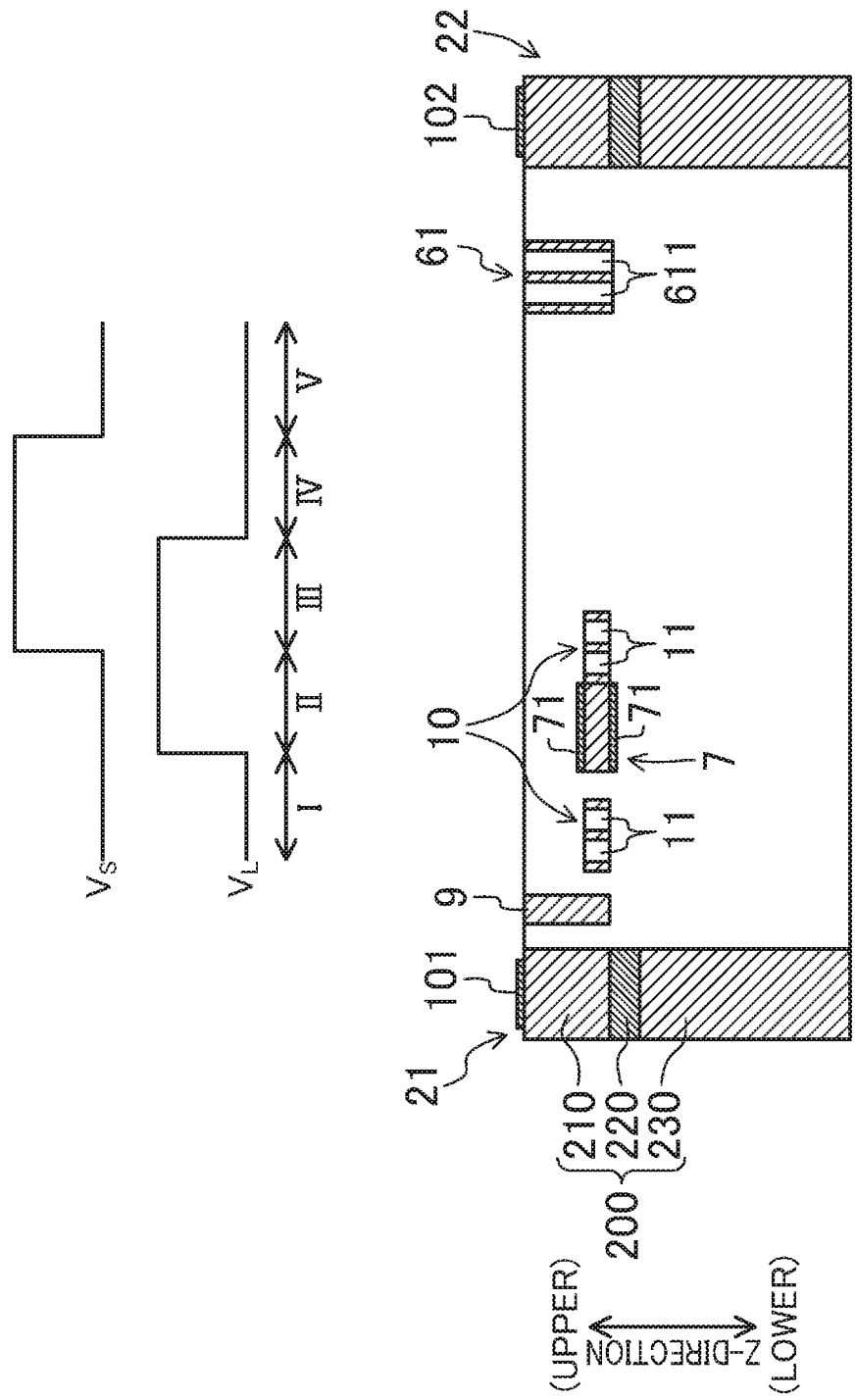

FIG.9A
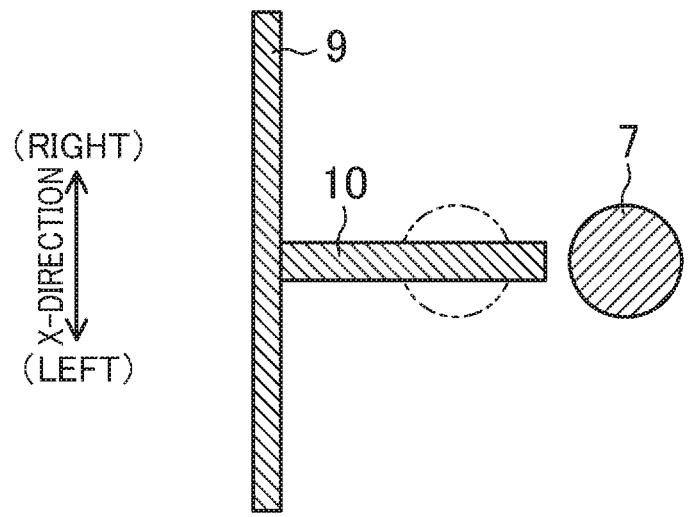
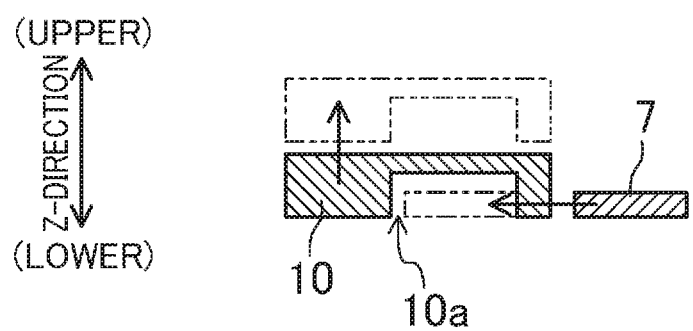

FIG.9B
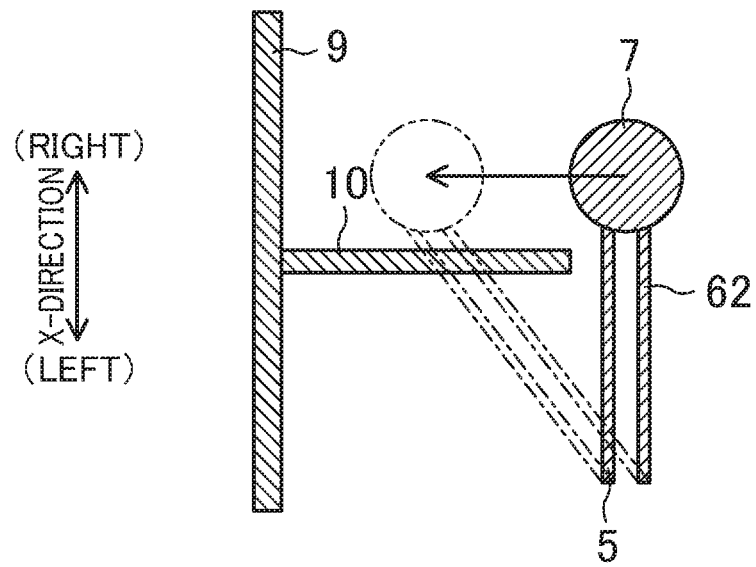
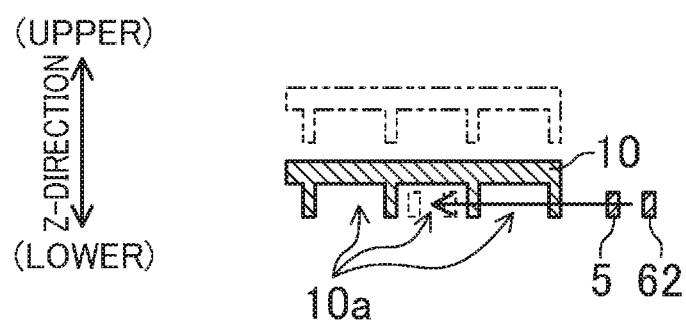

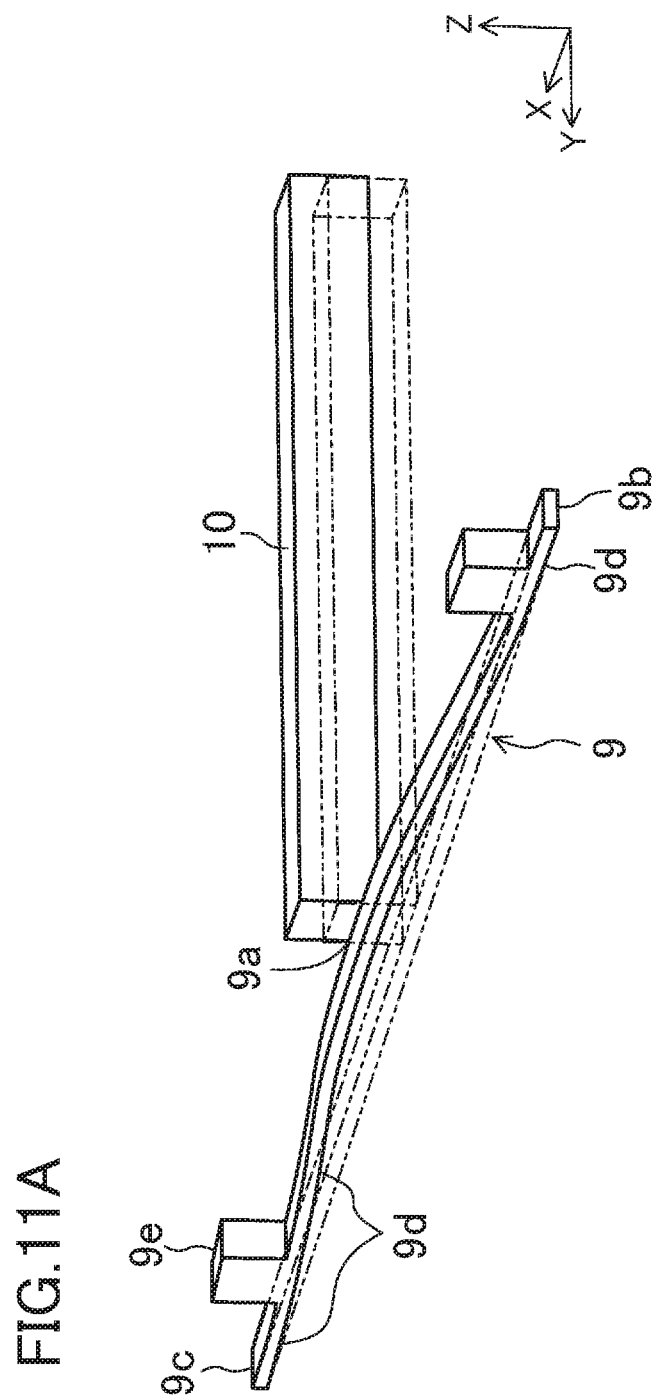

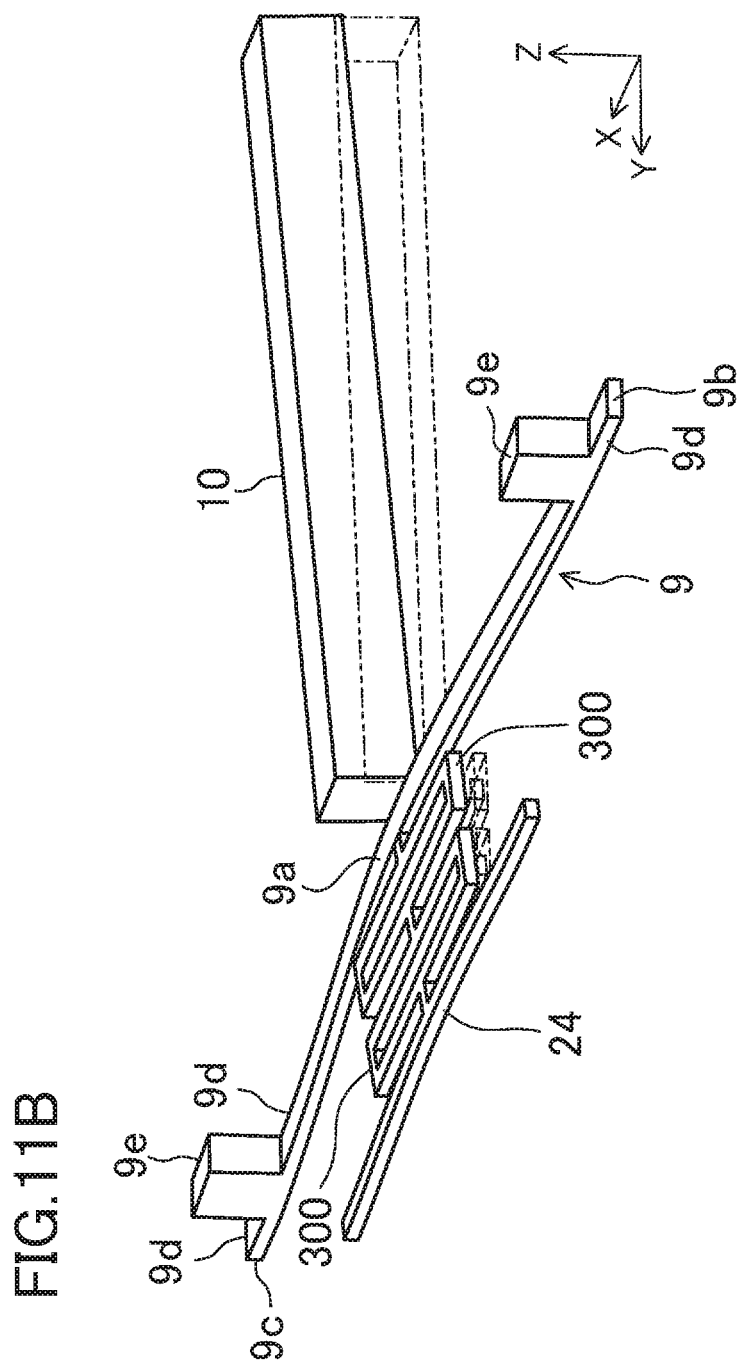

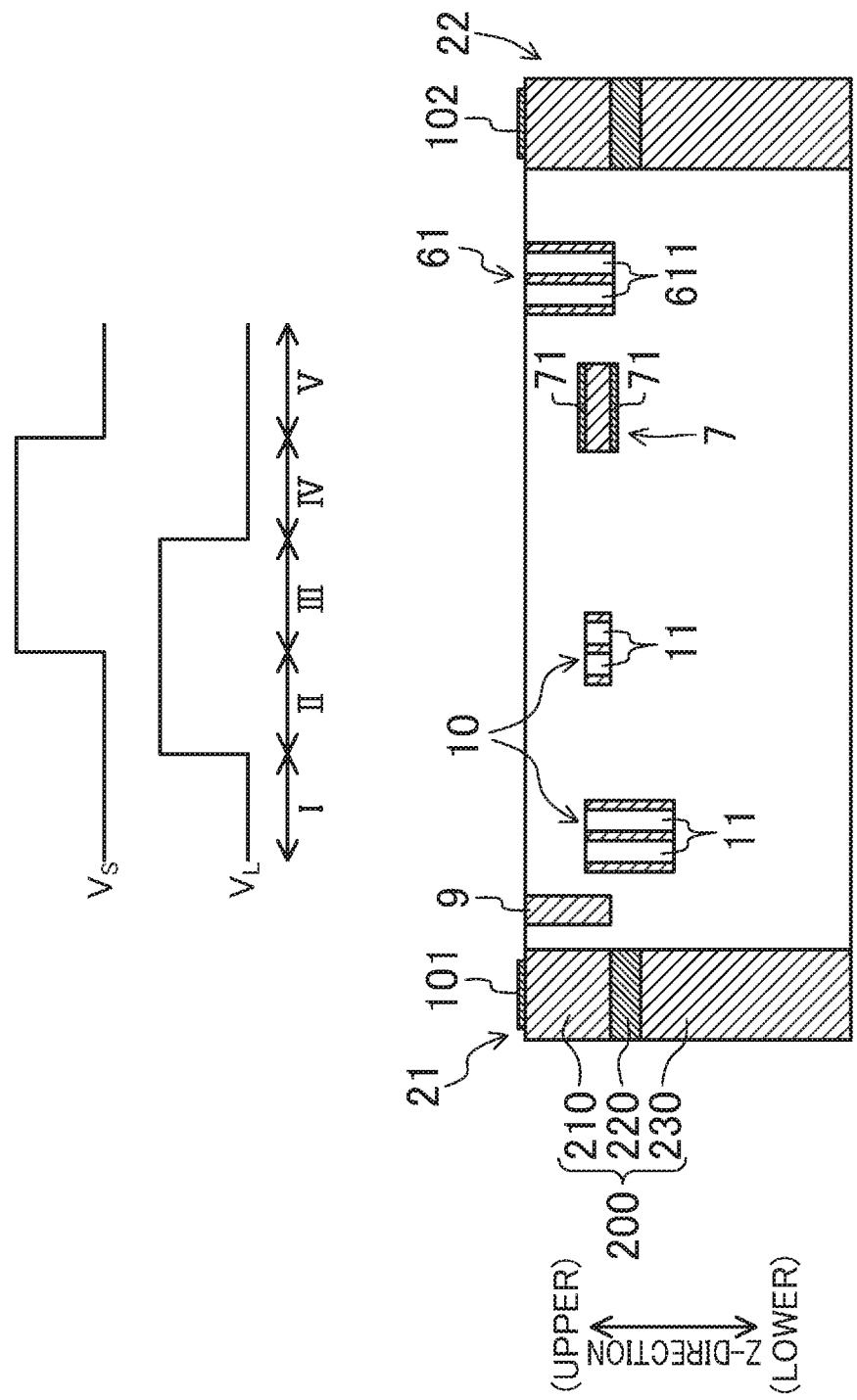

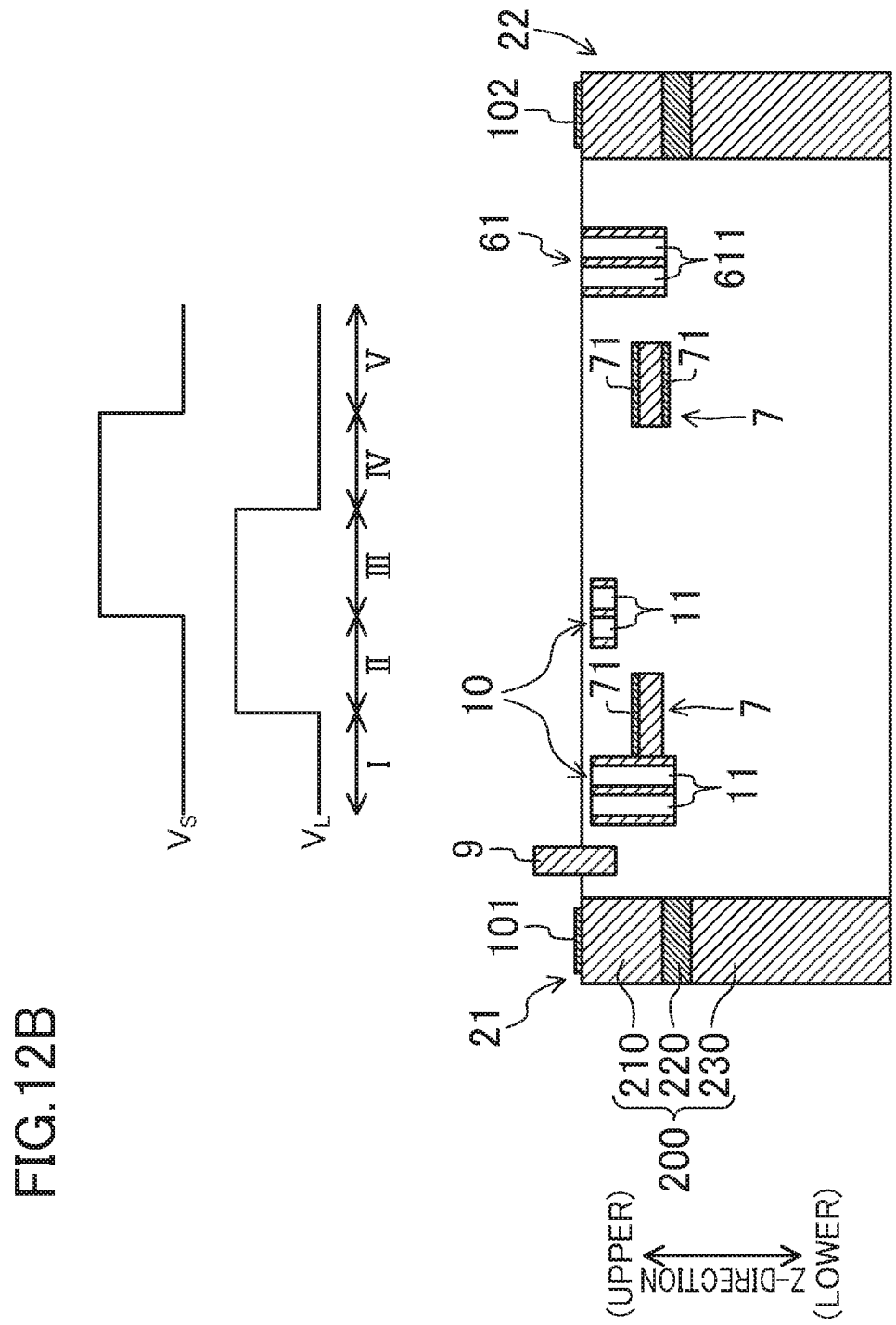

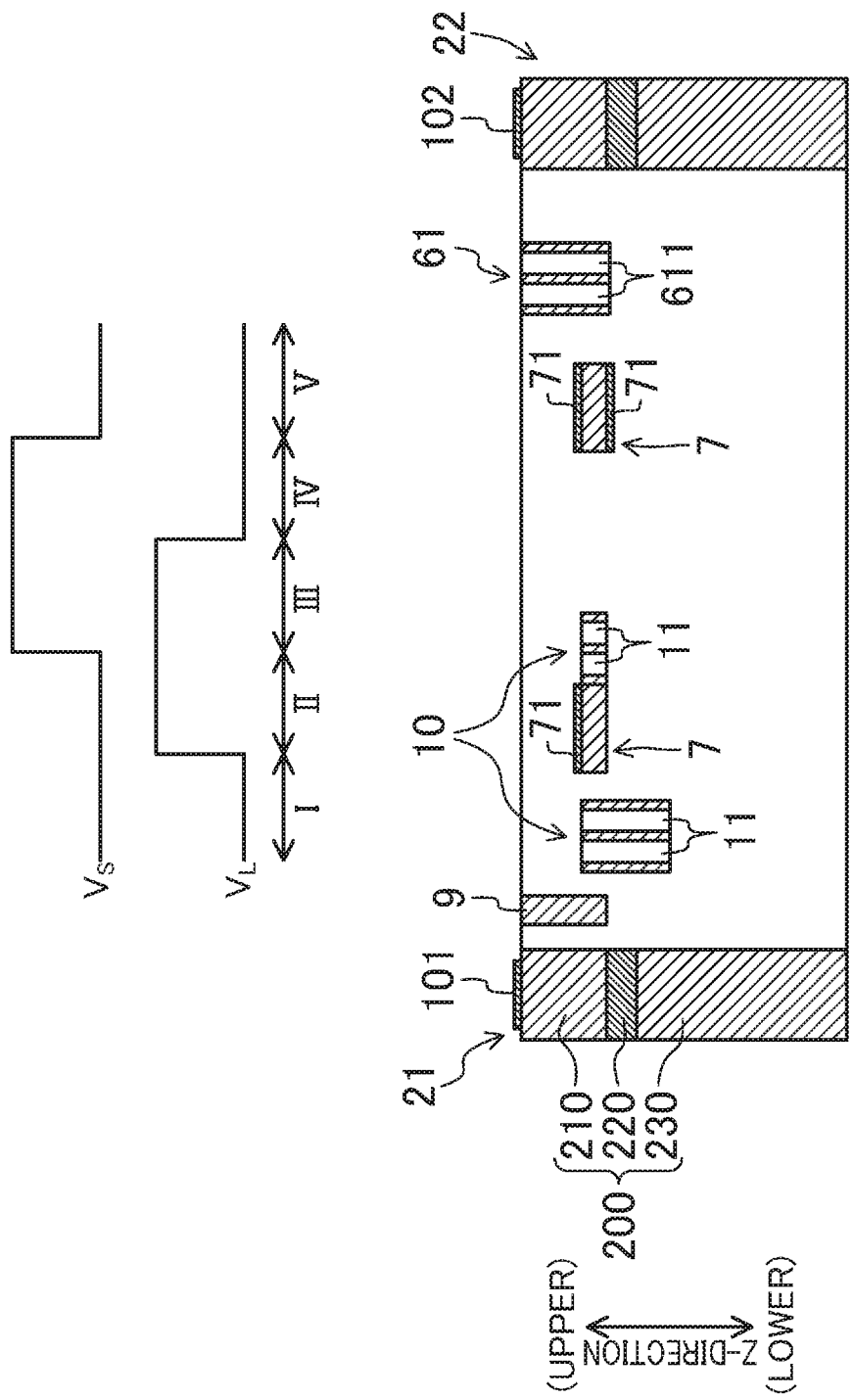

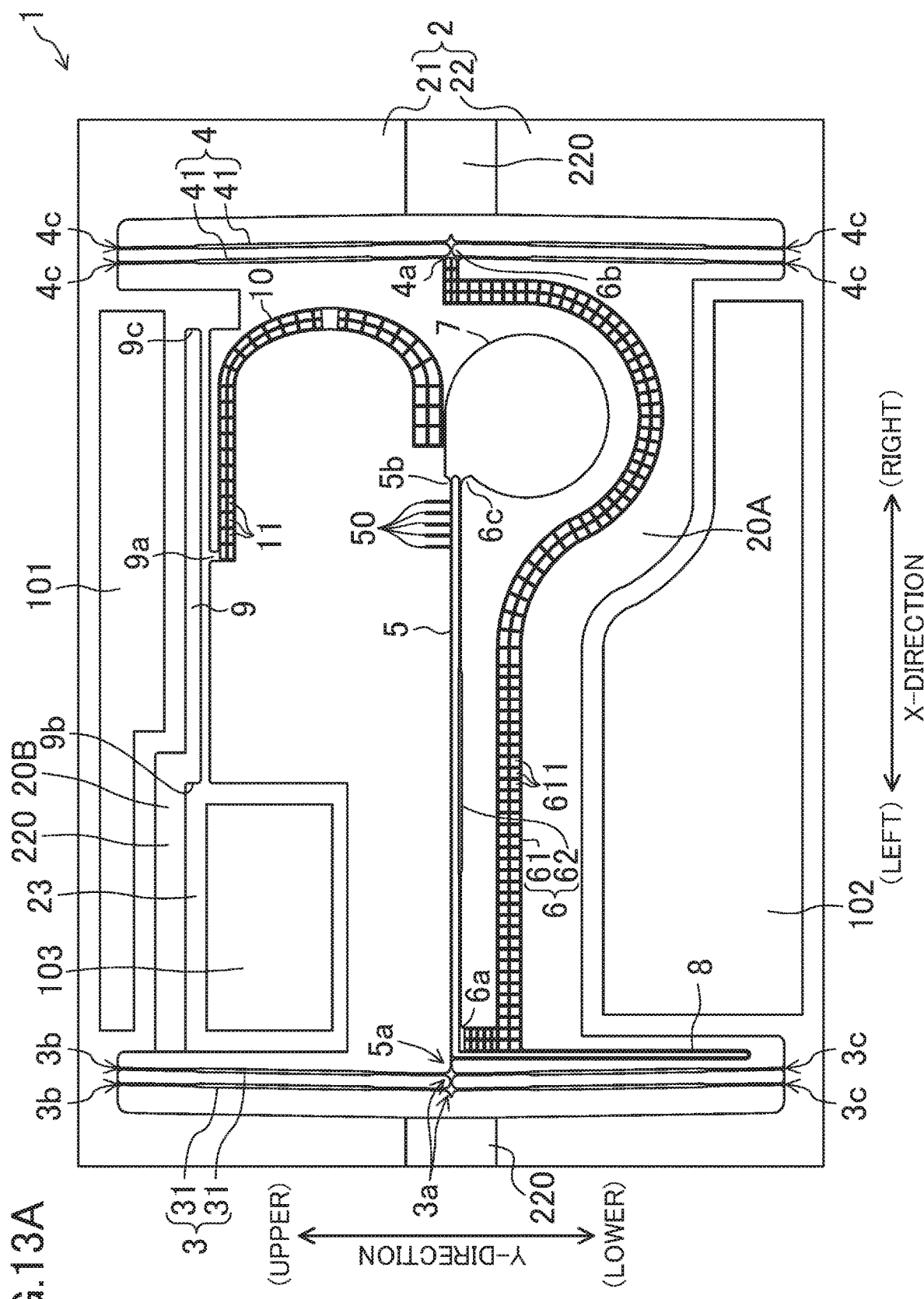

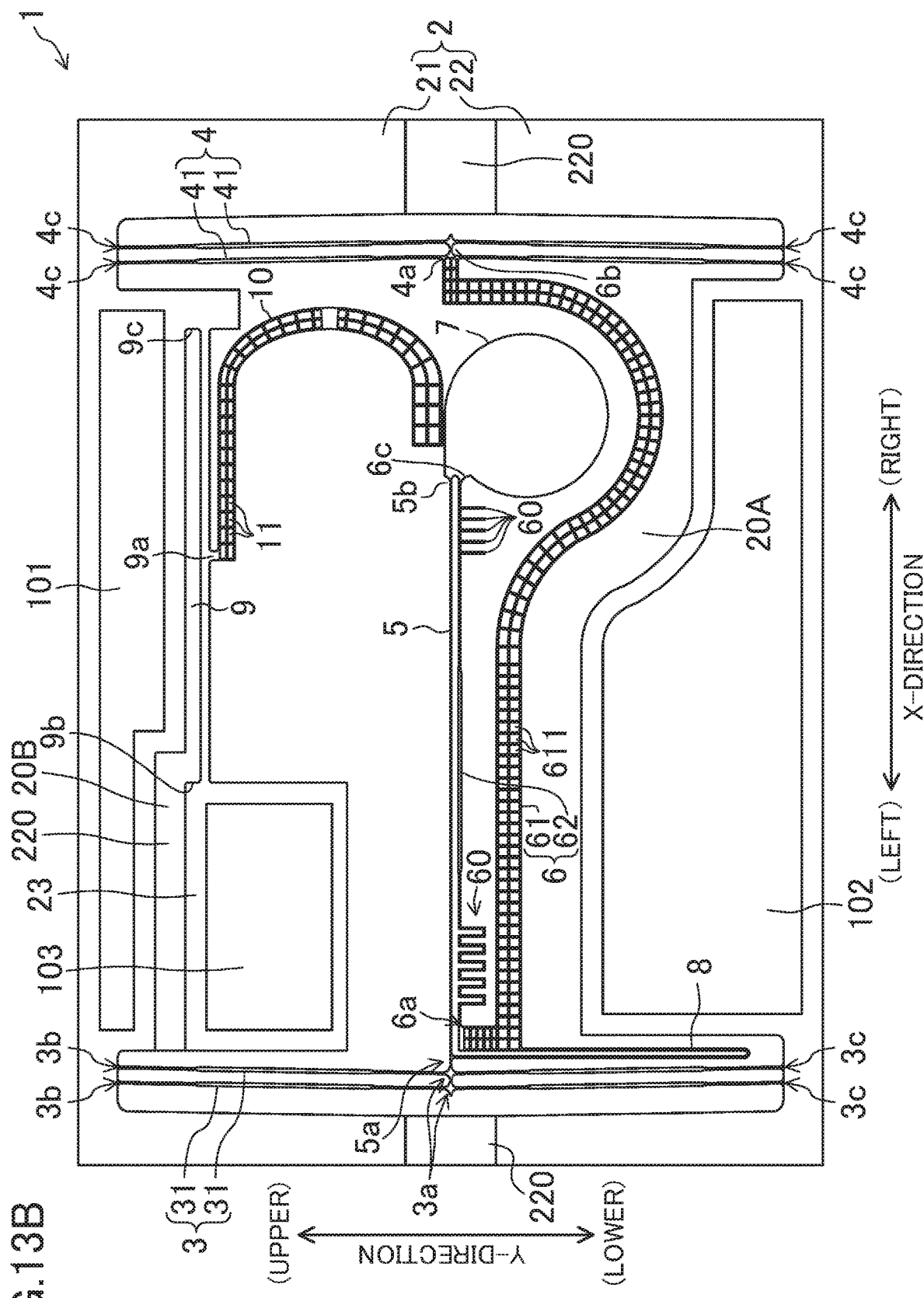

FIG.15
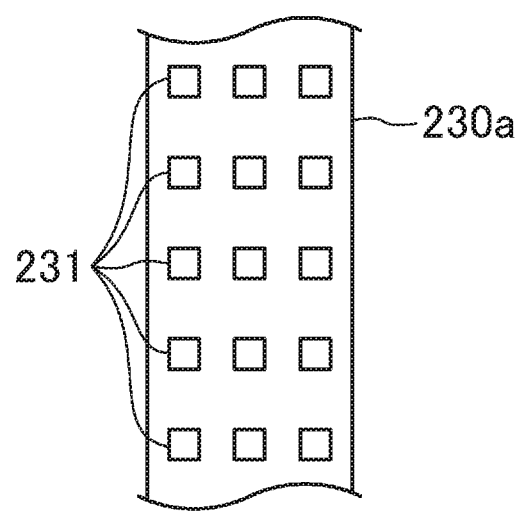
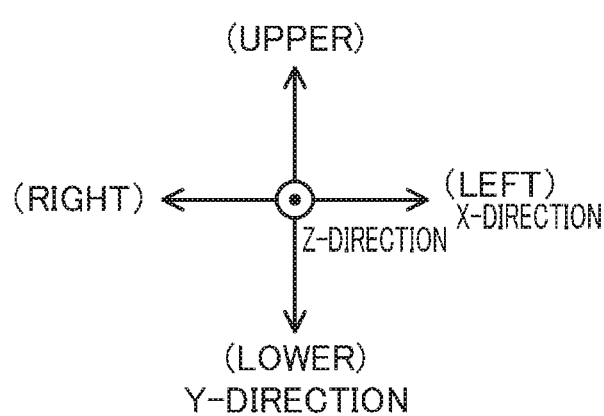

US 11,409,049 B2

MEMS ELEMENT AND OPTICAL APPARATUS USING THE SAME

TECHNICAL FIELD

The technique disclosed herein relates to a micro electromechanical systems (MEMS) element and an optical apparatus using the MEMS element.

BACKGROUND ART

Typically, an optical apparatus configured to change an optical path by means of a MEMS element has been known. Patent Document 1 discloses a technique in which an optical waveguide coupled to a thermal actuator and movable in a direction parallel to a substrate surface is arranged between other optical waveguides fixed apart from each other on the substrate surface and an optical path between the optical waveguides arranged in a fixed manner is switched by drive of the thermal actuator. Moreover, Patent Document 1 discloses a technique in which another thermal actuator drivable in a direction parallel to the substrate surface and crossing a drive direction of the thermal actuator is provided and a lock member coupled to the above-described optical waveguide and the above-described thermal actuator and another lock member coupled to the another thermal actuator are locked according to drive cancellation of the another thermal actuator to hold displacement of the movable optical waveguide.

CITATION LIST

Patent Document

PATENT DOCUMENT 1: U.S. Pat. No. 7,298,954

SUMMARY OF THE INVENTION

Technical Problem

However, in the configuration disclosed in Patent Document 1, the thermal actuator configured to drive the optical waveguide and the another thermal actuator configured to drive the another lock member are both driven in the direction parallel to the substrate surface, and therefore, a space for ensuring these drive regions is necessary. Thus, there is a problem that the sizes of the MEMS element and the optical apparatus increase.

The technique disclosed herein has been made in view of such a point, and an object of the technique is to provide a MEMS element configured so that displacement of a shutter can be held and size reduction can be realized and an optical apparatus using the MEMS element.

Solution to the Problem

For accomplishing the above-described object, the MEMS element disclosed herein includes a substrate, a fixing portion provided at the substrate, a first actuator provided at the fixing portion, a drive target member coupled to the first actuator, a third actuator provided at the fixing portion, and a restriction member coupled to the third actuator. The first actuator drives the drive target member in a direction parallel to or crossing an upper surface of the substrate. The third actuator drives the restriction member in a direction crossing a movement direction of the drive target member to position the restriction member within a movement plane of the drive target member such that the restriction member restricts displacement of the drive target member.

According to this configuration, the third actuator is driven in a direction crossing a drive direction of the first actuator. Thus, as viewed in plane, drive regions of the drive target member and the restriction member configured to restrict displacement of the drive target member can be narrowed, and reduction in the size of the MEMS element can be realized.

Another MEMS element disclosed herein includes a substrate, a fixing portion provided at the substrate, a first actuator including a first drive beam coupled to the fixing portion and driven by heating of the first drive beam, a drive target member coupled to the first actuator, a third actuator coupled to the fixing portion, including a third drive beam having different structures between a first surface and a second surface facing the first surface, and driven by heating of the third drive beam, and a restriction member coupled to the third actuator. The first actuator drives the drive target member in a direction parallel to an upper surface of the substrate. The third actuator drives the restriction member in a direction crossing the upper surface of the substrate to position the restriction member within a movement plane of the drive target member such that the restriction member restricts displacement of the drive target member.

According to this configuration, the third actuator can be driven in a direction crossing a drive direction of the first actuator. Thus, as viewed in plane, drive regions of the drive target member and the restriction member configured to restrict displacement of the drive target member can be narrowed. Moreover, the first actuator and the third actuator are thermal actuators to be driven by heating. Thus, the drive amounts of these actuators can be increased even with a low voltage, and the displacement amounts of the drive target member and the restriction member can be increased. Consequently, the drive voltage of the MEMS element can be reduced, and power consumption can be decreased.

Moreover, the optical apparatus disclosed herein includes the above-described MEMS element, a first electrode arranged on the fixing portion of the MEMS element and electrically connected to a first end portion of the first actuator and a first end portion of the third actuator in the MEMS element, a second electrode arranged on the fixing portion of the MEMS element and electrically connected to a second end portion of the first actuator of the MEMS element, and a third electrode electrically connected to a second end portion of the third actuator. An optical path is blocked or opened or light is reflected by the drive target member of the MEMS element.

According to this configuration, the third actuator is driven in the direction crossing the drive direction of the first actuator. Thus, as viewed in plane, the drive regions of the drive target member and the restriction member configured to restrict displacement of the drive target member can be narrowed, and reduction in the size of the optical apparatus can be realized. Moreover, displacement of the drive target member can be held with no power supply, and therefore, power consumption can be decreased in the case of, e.g., blocking or opening the optical path with the drive target member being displaced.

Advantages of the Invention

According to the MEMS element of the present disclosure, the third actuator is driven in the direction crossing the drive direction of the first actuator, and therefore, reduction in the size of the element can be realized. Moreover, displacement of the drive target member can be held with no power supply. Further, according to the optical apparatus of the present disclosure, reduction in the size of the apparatus can be realized, and power consumption can be decreased.

BRIEF DESCRIPTION OF THE DRAWINGS

FIG. 2 is a sectional view along an II-II line in FIG. 1.

FIG. 8A is a view of a change in the drive voltage of the shutter apparatus according to the first embodiment and arrangement of each member in association with such a change.

FIG. 8C is a view of a change in the drive voltage of the shutter apparatus according to the first embodiment and arrangement of each member in association with such a change.

FIG. 8E is a view of a change in the drive voltage of the shutter apparatus according to the first embodiment and arrangement of each member in association with such a change.

FIG. 9A is a view of a position relationship between the drive target member and the restriction member according to a variation before and after drive.

FIG. 9B is a view of a position relationship between the drive target member and another restriction member according to a variation before and after drive.

FIG. 11A is a view of the states of a third actuator and a restriction member before and after drive.

FIG. 11B is a view of the states of another third actuator and the restriction member before and after drive.

FIG. 12A is a view of a change in the drive voltage of a shutter apparatus according to a third embodiment and arrangement of each member in association with such a change.

FIG. 12B is a view of a change in the drive voltage of the shutter apparatus according to the third embodiment and arrangement of each member in association with such a change.

FIG. 12C is a view of a change in the drive voltage of the shutter apparatus according to the third embodiment and arrangement of each member in association with such a change.

FIG. 13A is a plan view of a shutter apparatus according to a fourth embodiment.

FIG. 13B is a plan view of another shutter apparatus according to the fourth embodiment.

FIG. 15 is a plan view of a configuration of another heat dissipation block.

DESCRIPTION OF EMBODIMENTS

Hereinafter, the present embodiments will be described in detail with reference to the drawings. Description of the preferable embodiments below will be set forth merely as examples in nature, and is not intended to limit the present invention, an application thereof, and a use application thereof at all.

First Embodiment

[Configuration of Shutter Apparatus]

Figure 1:
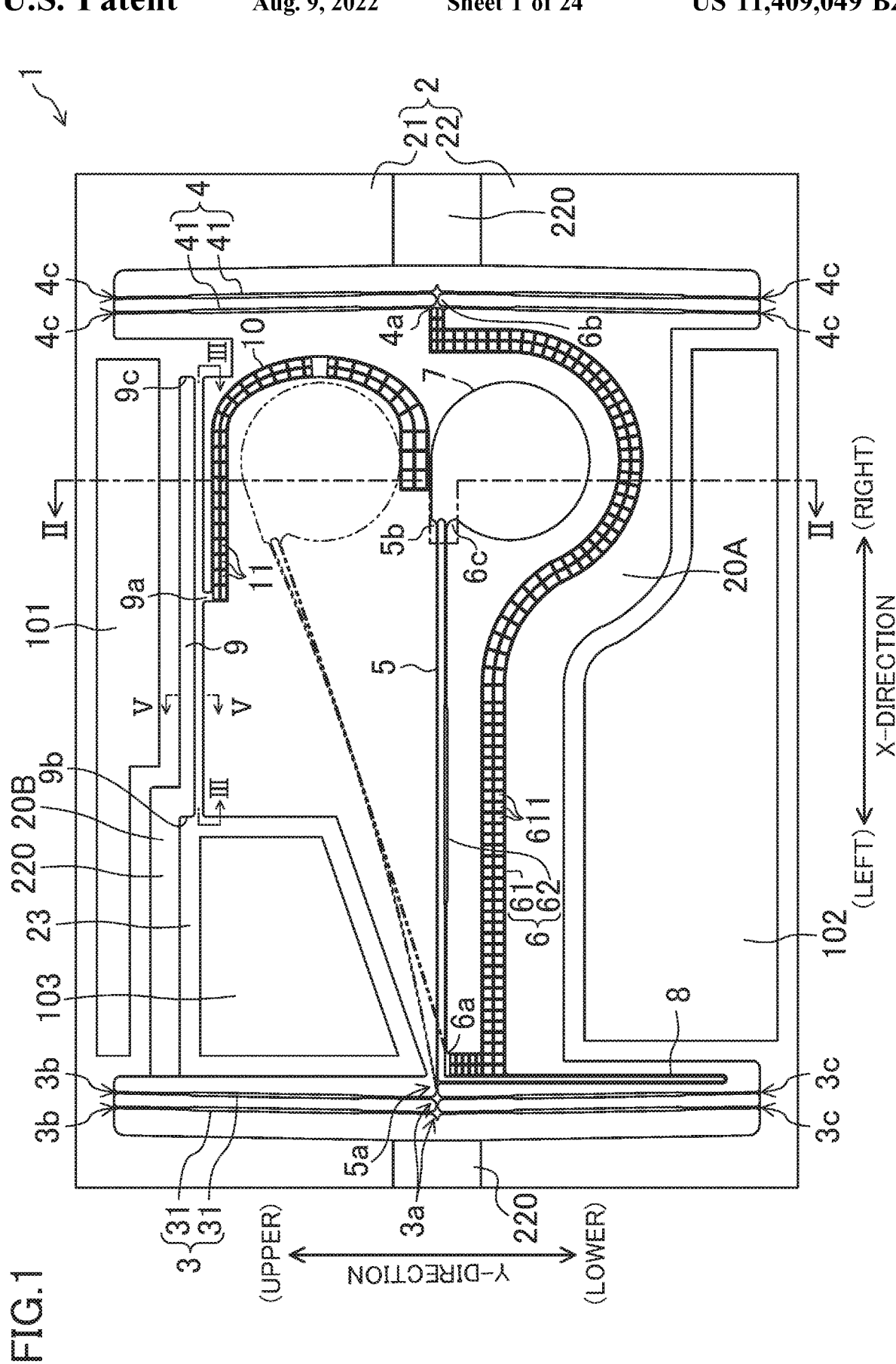
FIG. 1 is a plan view of a shutter apparatus according to a first embodiment.

FIG. 1 illustrates a plan view of a shutter apparatus according to the present embodiment, and FIG. 2 illustrates a sectional view along an II-II line in FIG. 1. Note that a chain double-dashed line in FIG. 1 indicates the shutter apparatus 1 in a state in which displacement of a drive target member 7 is held. The shutter apparatus 1 includes the following members on a SOI substrate 200. The shutter apparatus 1 includes a fixing portion 2, a first actuator 3 and a second actuator 4 coupled to the fixing portion 2, a first beam 5 having a first end portion 5a and a second end portion 5b and configured such that the first end portion 5a is coupled to the first actuator 3, and a second beam 6 having a first end portion 6b and a second end portion 6c and configured such that the first end portion 6b is coupled to the second actuator 4. Moreover, the shutter apparatus 1 includes the drive target member 7 coupled to the second end portion 5b of the first beam 5 and the second end portion 6c of the second beam 6, a coupling member 8 coupling the first beam 5 and the second beam 6 to each other, a third actuator 9 coupled to the fixing portion 2, a restriction member 10 coupled to an intermediate portion 9a of the third actuator 9, a first electrode 101, a second electrode 102, and a third electrode 103.

Moreover, the SOI substrate 200 includes a device layer (a first silicon layer 210), a Box layer (an oxide layer 220), and a handle layer (a second silicon layer 230). For example, the thickness of the device layer is 30 μm, the thickness of the Box layer is 1 μm, and the thickness of the handle layer is 250 μm.

Hereinafter, a longitudinal direction of the first beam 5 will be, for the sake of convenience in description, referred to as a "X-direction," a longitudinal direction of the first actuator 3 and the second actuator 4 will be referred to as a "Y-direction," and a thickness direction of the shutter apparatus 1 will be referred to as a "Z-direction." Note that in the X-direction, a left side in FIG. 1 will be sometimes merely referred to as a "left side," and a right side in FIG. 1 will be sometimes merely referred to as a "right side." In the Y-direction, an upper side in FIG. 1 will be sometimes merely referred to as an "upper side," and a lower side in FIG. 1 will be sometimes merely referred to as a "lower side." In the Z-direction, an upper side in FIG. 2 will be sometimes referred to as an "upper surface," and a lower side in FIG. 2 will be sometimes referred to as a "lower surface." The SOI substrate 200 will be sometimes merely referred to as a "substrate 200." Moreover, the first end portion 5a of the first beam 5 or the first end portion 6b of the second beam 6 will be sometimes referred to as a "base end," and the second end portion 5b of the first beam 5 or the second end portion 6c of the second beam 6 will be sometimes referred to as a "tip end."

As illustrated in FIG. 1, the shutter apparatus 1 has, for example, a rectangular entire shape as viewed in plane. The fixing portion 2 is a frame forming such a rectangular entire shape of the shutter apparatus 1 as viewed in plane. The fixing portion 2 includes a first base member 21 and a second base member 22 arranged facing each other in the Y-direction. Moreover, the fixing portion 2 includes a third base member 23 between the first base member 21 and the second base member 22. The first silicon layer 210 of the first base member 21 and the first silicon layer 210 of the third base member 23 are coupled to each other through the third actuator 9. Any of the first base member 21, the second base member 22, and the third base member 23 is formed in a shape covering as broad area as possible while movable areas of the first actuator 3, the second actuator 4, the first beam 5, the second beam 6, the drive target member 7, the coupling member 8, the third actuator 9, and the restriction member 10 are ensured.

Note that the fixing portion 2 is divided into three parts of the first base member 21, the second base member 22, and the third base member 23 at the first silicon layer 210, but is connected as one at the oxide layer 220 and the second silicon layer 230. Thus, the relative positions of the first base member 21, the second base member 22, and the third base member 23 are fixed, and the movable members 3 to 10 can be supported by the first base member 21, the second base member 22, and the third base member 23.

Moreover, the fixing portion 2 has an opening 20A among the first base member 21, the second base member 22, and the third base member 23, and as viewed in plane, the first actuator 3, the second actuator 4, the first beam 5, the second beam 6, the drive target member 7, the coupling member 8, the third actuator 9, and the restriction member 10 are each arranged in the opening 20A. The fixing portion 2 and each of the movable members 3 to 10 arranged in the opening 20A form a MEMS element.

As described above, the fixing portion 2 is formed in the shape covering as broad area as possible while the movable areas of the movable members are ensured, and therefore, ensures high stiffness necessary as the frame supporting the first base member 21, the second base member 22, and the third base member 23.

The first actuator 3 includes two actuators 31 arranged in parallel. These two actuators 31 are rod-shaped drive beams extending in the Y-direction, and are coupled to each other at an intermediate portion 3a at the substantially center from a first end portion 3b to a second end portion 3c of the first actuator 3 in the longitudinal direction thereof. As described above, two actuators 31 are coupled to each other at the intermediate portion 3a, and therefore, drive force of two actuators 31 is combined so that the first actuator 3 can provide great drive force.

The first end portions 3b of two actuators 31 are coupled to the first base member 21. The second end portions 3c of two actuators 31 are coupled to the second base member 22.

Moreover, the first actuator 3 does not extend straight in the Y-direction, and the intermediate portion 3a is slightly bent to protrude leftward in the X-direction as a drive direction of the first actuator 3 or is slightly curved to entirely expand leftward in the X-direction.

The second actuator 4 includes two actuators 41 arranged in parallel. These two actuators 41 are rod-shaped drive beams extending in the Y-direction, and are coupled to each other at an intermediate portion 4a at the substantially center from a first end portion 4b to a second end portion 4c of the second actuator 4 in a longitudinal direction thereof. As described above, two actuators 41 are coupled to each other at the intermediate portion 4a, and therefore, drive force of two actuators 41 is combined so that the second actuator 4 can provide great drive force.

The first end portions 4b of two actuators 41 are coupled to the first base member 21. The second end portions 4c of two actuators 41 are coupled to the second base member 22.

Moreover, the second actuator 4 does not extend straight in the Y-direction, and the intermediate portion 4a is slightly bent to protrude rightward in the X-direction as a drive direction of the second actuator 4 or is slightly curved to entirely expand rightward in the X-direction.

The first actuator 3 and the second actuator 4 are thermal actuators configured to thermally expand by heating by power distribution to generate drive force. Moreover, as described above, the first and second actuators 3, 4 are bent or curved in the drive direction thereof, and therefore, upon thermal expansion by heating, the first and second actuators 3, 4 are not bent or curved to the opposite side of the drive direction. Thus, the first and second actuators 3, 4 can be reliably bent or curved in the drive direction.

The first actuator 3 is arranged on the left side in the X-direction in the shutter apparatus 1, the second actuator 4 is arranged on the right side in the X-direction in the shutter apparatus 1, and the first actuator 3 and the second actuator 4 face each other as viewed in plane.

The first beam 5 is a rod-shaped member extending in the X-direction. The first end portion 5a of the first beam 5, i.e., the base end of the first beam 5, is coupled to the intermediate portion 3a of the first actuator 3. The second end portion 5b of the first beam 5, i.e., the tip end of the first beam 5, is coupled to the drive target member 7.

The second beam 6 is a member having a folded-back structure, and includes a first member 61 extending from the intermediate portion 4a of the second actuator 4 to the vicinity of the intermediate portion 3a of the first actuator 3 and a second member 62 folded back from an end portion of the first member 61 toward the second actuator 4. The first end portion 6b of the second beam 6, i.e., the base end of the second beam 6, is coupled to the intermediate portion 4a of the second actuator 4. The second end portion 6c of the second beam 6, i.e., the tip end of the second beam 6, is coupled to the drive target member 7.

The first member 61 is a member partially having a half-arc shape extending around the drive target member 7, for example. Moreover, the first member 61 at least partially has a highly-elastic region having a higher elastic modulus than that of the second member 62, and is formed wide, for example. As described later, even when the second beam 6 is driven by the second actuator 4, the first member 61 holds the shape thereof with almost no elastic deformation, and transmits the drive force of the second actuator 4 to the second member 62. In addition, such a highly-elastic region may be formed in such a manner that part of the first member 61 has a greater thickness than that of the second member 62 or a metal film is formed on part of the first member 61.

Further, lightening portions (holes) 611 are formed at the first member 61 of the second beam 6. With this configuration, the effect of decreasing the mass of the first member 61 and increasing a resonance frequency is obtained. Further, in the case of using the thermal actuator, the surface area of the first member 61 is increased by part of the second beam 6, i.e., a lightening structure of the first member 61, and therefore, heat dissipation is accelerated. Consequently, heat transmitted from the second actuator 4 to the drive target member 7 can be reduced. Note that one or both of the first beam 5 and the second beam 6 can be provided with the lightening portions, as necessary.

The second member 62 is a rod-shaped member extending in the X-direction from an end portion 6a of the first member 61 and having the substantially same width as that of the first beam 5. The second member 62 is arranged in parallel to the first beam 5 on the lower side of the first beam 5 in the Y-direction. Note that "arranged in parallel" indicates, including subsequent description, that two members are arranged with a substantially parallel relationship. Moreover, a portion where the first beam 5 and the second member 62 of the second beam 6 are arranged in parallel to each other will be sometimes referred to as a "parallel arrangement portion." The first beam 5 and the second member 62 of the second beam 6 in parallel are coupled to the drive target member 7 from the same direction. In other words, the tip end side of the first beam 5 is folded back at a portion coupled to the drive target member 7, and therefore, the first beam 5 and the second member 62 of the second beam 6 are arranged in parallel at a coupling portion between each of the first beam 5 and the second beam 6 and the drive target member 7. In other words, the tip end side of the second member 62 of the second beam 6 is folded back at a portion coupled to the drive target member 7, and therefore, the first beam 5 and the second member 62 of the second beam 6 are arranged in parallel at the coupling portion between each of the first beam 5 and the second beam 6 and the drive target member 7.

The first beam 5 pulls the drive target member 7 from the second end portion 5b in an extension direction of the first beam 5, and the second beam 6 pushes the drive target member 7 from the second end portion 6c in an extension direction of the second beam 6. In this manner, the drive target member 7 is driven. As described later, the first beam 5 and the second member 62 of the second beam 6 are driven by the first actuator 3 and the second actuator 4 to elastically deform, thereby moving the drive target member 7 to another position on a XY plane. Note that contrary to the above-described operation, the first beam 5 may push the drive target member 7, and the second beam 6 may pull the drive target member 7.

Note that the second actuator 4 of the present embodiment is not necessarily provided, and the second beam 6 may be directly coupled to the fixing portion 2. Specifically, the second beam 6 may include only the second member 62, and the end portion of the second member 62 opposite to the second end portion 6c may be directly coupled to the fixing portion 2 (the first base member 21 or the second base member 22). In this case, the second member 62 may be directly coupled to the fixing portion 2 in a substantially straight state or a state with a slight curvature, or may be coupled to the fixing portion 2 after the vicinity of the end portion of the second member 62 opposite to the second end portion 6c has been bent.

The drive target member 7 is arranged between the first actuator 3 and the second actuator 4 facing each other. More specifically, the drive target member 7 is arranged at a position closer to the second actuator 4. In the shutter apparatus 1, the drive target member 7 functions as a shutter configured to close or open a not-shown optical path. Thus, the drive target member 7 is formed in a planar shape slightly larger than the section of the optical path, and is specifically formed in a circular shape.

The drive target member 7 is formed thinner than other members forming the above-described displacement enlarging mechanism. With this configuration, the mass of the drive target member 7 is decreased, and a resonance frequency is increased. Moreover, metal films 71 such as multilayer films made of Au/Pt/Ti are each formed on both surfaces of the drive target member 7.

The coupling member 8 is a hairpin-shaped member. One end of the coupling member 8 is coupled to the first beam 5, and is folded back after having extended in the Y-direction. The other end of the coupling member 8 is coupled to the first member 61 of the second beam 6. Thus, the coupling member 8 couples the first beam 5 and the second beam 6 to each other. With such a coupling member 8, when the first end portion 6b of the second beam 6 is driven by the second actuator 4, slight counterclockwise rotation of the first member 61 of the second beam 6 about the first end portion 6b on the XY plane can be prevented, and the amount of displacement of the drive target member 7 can be more increased. In the case of employing the thermal actuator, heat is also dissipated from the coupling member 8, and therefore, heat transfer to the drive target member 7 can be prevented. Moreover, great reduction in the amount of drive of the first end portion 6b by the second actuator 4 is prevented. Further, in another example for preventing the above-described rotation, the coupling member 8 may extend in a direction substantially perpendicular to the second beam 6 from the first member 61 of the second beam 6, and may be coupled to the fixing portion 2 (more specifically, the first base member 21). Moreover, a not-shown anti-rotation mechanism configured to prevent rotation by contact between the first member 61 and the fixing portion 2 (more specifically, the first base member 21) upon rotation of the first member 61 may be provided at the fixing portion 2 or the first member 61.

The third actuator 9 is a rod-shaped drive beam extending in the X-direction, and a first end portion 9b is coupled to the fixing portion 2 (the third base member 23) and a second end portion 9c is coupled to the fixing portion 2 (the first base member 21). The third actuator 9 is also a thermal actuator configured to thermally expand by heating by power distribution to generate drive force. Note that unlike the first and second actuators 3, 4, a drive direction of the third actuator 9 is not the X-direction, but is the Z-direction. In this case, the drive direction is the upper side in the Z-direction. Such displacement depends on the shape of the third actuator 9, and details thereof will be described later.

The restriction member 10 is a member having a portion coupled to the intermediate portion 9a of the third actuator 9 and extending in the X-direction and a portion extending from such an end portion and formed in a substantially half-arc shape as viewed in plane, and has lightening portions (holes) 11. Further, the thickness of the restriction member 10 is formed identical to the thickness of the drive target member 7. When the third actuator 9 is driven, the restriction member 10 coupled to the intermediate portion 9a of the third actuator 9 is displaced toward the upper side in the Z-direction as the drive direction of the third actuator 9. With the lightening portions (holes) 11, the mass of the restriction member 10 is decreased, and therefore, the resonance frequency of the restriction member 10 can be increased. Moreover, displacement time of the restriction member 10 in the Z-direction is shortened. Note that the substantially half-arc portion is in a shape surrounding part of an outer edge of the drive target member 7 when the drive target member 7 has moved to a later-described target position. Note that the shape of such a portion is not limited to the substantially half-arc shape, and may be a U-shape, for example.

[Third Actuator]

Figure 3A:
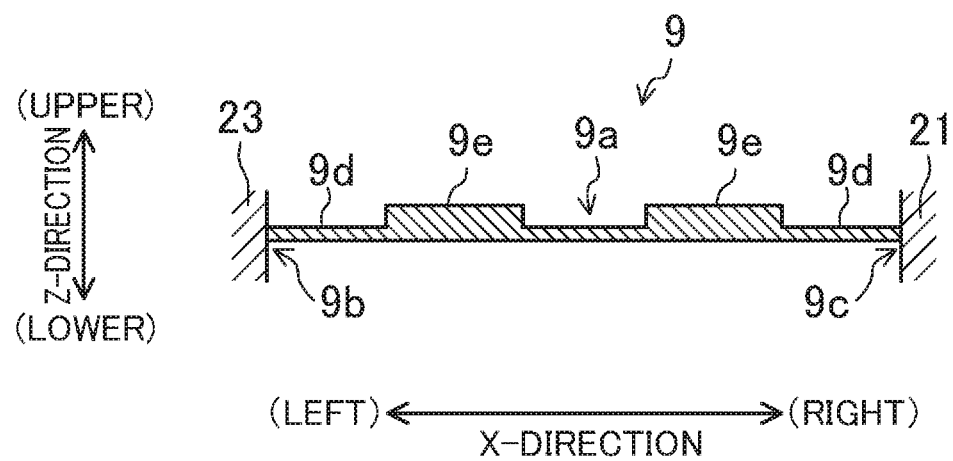
FIG. 3A is a schematic sectional view of a third actuator along an line in FIG. 1 before drive.
Figure 3B:
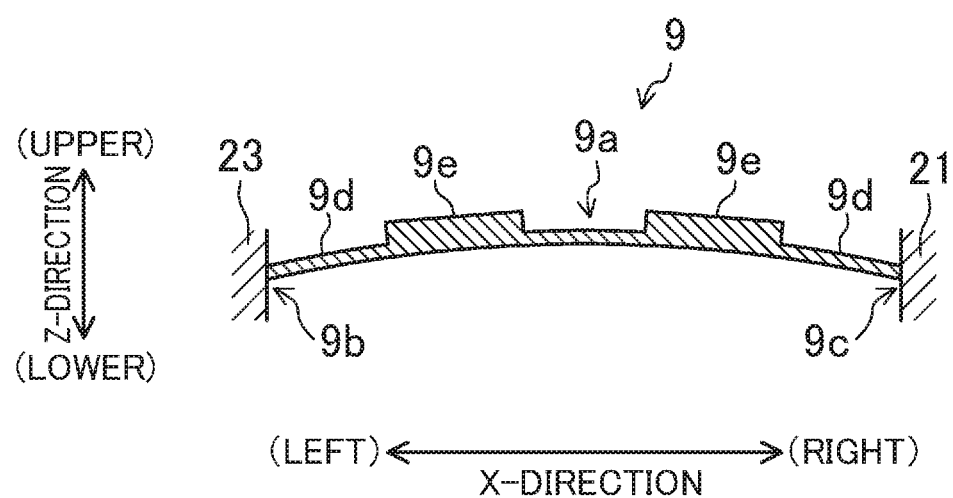
FIG. 3B is a schematic sectional view of the third actuator along the III-III line in FIG. 1 after drive.
Figure 4:
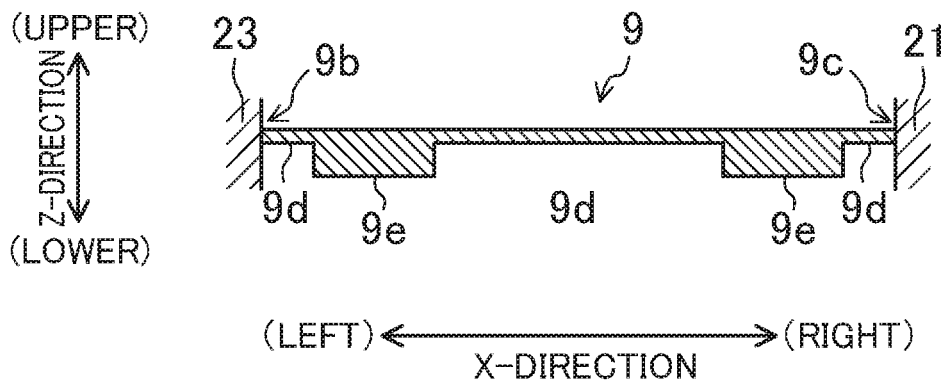
FIG. 4 is a schematic sectional view of another third actuator.
Figure 5A:
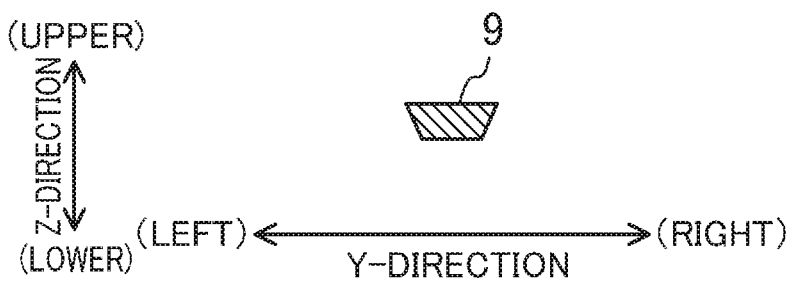
FIG. 5A is a schematic sectional view of the third actuator along a V-V line in FIG. 1.
Figure 5B:
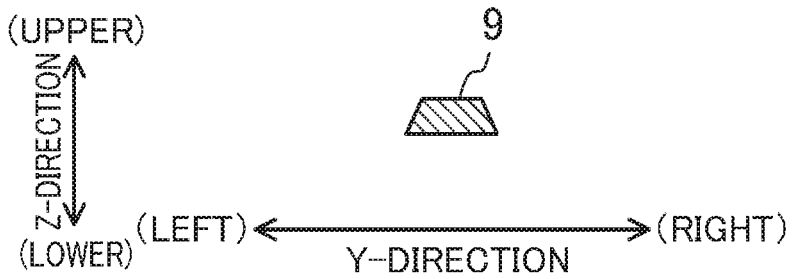
FIG. 5B is a schematic sectional view of another third actuator.

FIG. 3A illustrates a schematic sectional view of the third actuator 9 along an line in FIG. 1 before drive, and FIG. 3B illustrates a schematic sectional view of the third actuator 9 illustrated in FIG. 3A after drive. FIG. 4 illustrates another example of the structure illustrated in FIG. 3A. FIG. 5A illustrates a schematic sectional view of the third actuator 9 along a V-V line in FIG. 1, and FIG. 5B illustrates another example of the structure illustrated in FIG. 5B. Note that in the third actuator 9 illustrated in FIG. 3A, the section corresponding to FIG. 5A is in a rectangular shape, but may be the sectional structure illustrated in FIG. 5A.

As illustrated in FIG. 3A, the thickness of the third actuator 9 in the Z-direction is not uniform, and has an asymmetric shape in the Z-direction. Specifically, the third actuator 9 has first portions 9*d* having a substantially-constant thickness and second portions 9*e* as raised portions whose thickness toward the upper side in the Z-direction with respect to the first portion 9*d* is increased.

Both end portions 9*b*, 9*c* are fixed to the fixing portion 2, and therefore, when the third actuator 9 having such a shape thermally expands by heating by power distribution, stretching in the X-direction is reduced. Moreover, in the third actuator 9, the thickness in the Z-direction is smaller than the width in the Y-direction. Thus, by thermal expansion, the third actuator 9 tends to displace in the Z-direction as a more-easily displaceable direction. Note that the width in the Y-direction is several μm to several tens of μm as representative, and the thickness in the Z-direction is several μm.

The first portions 9*d* are each provided in the vicinity of both end portions 9*b*, 9*c* of the third actuator 9, and both end portions 9*b*, 9*c* are fixed. Thus, the third actuator 9 is easily deformable in the Z-direction. Moreover, the thinner first portions 9*d* is more greatly deformed in the vicinity of a corner portion as a boundary between the first portion 9*d* and the second portions 9*e*, and therefore, a region including the corner portion is lifted upward in the Z-direction. As a result, the intermediate portion 9*a* of the third actuator 9 is driven upward in the Z-direction as illustrated in FIG. 3B.

Moreover, when power distribution to the third actuator 9 is stopped, the third actuator 9 tends to quickly return to an original length due to natural cooling. Thus, the drive force of the third actuator 9 in the Z-direction is eliminated, and the third actuator 9 returns to a position illustrated in FIG. 3A.

Note that as illustrated in FIG. 4, when the second portions 9*e* as the raised portions are formed such that the thickness toward the lower side in the Z-direction with respect to the first portion 9*d* is increased, the region including the above-described corner portion is lowered in the Z-direction upon thermal expansion of the third actuator 9. As a result, the intermediate portion 9*a* of the third actuator 9 is driven downward in the Z-direction.

Note that the shape for driving, in the Z-direction, the third actuator 9 extending in the X-direction is not specifically limited to the configurations illustrated in FIGS. 3A and 4. For example, as illustrated in FIG. 5A, when the sectional shape of the third actuator 9 is a substantially trapezoidal shape whose width is narrowed toward the upper side in the Z-direction, the third actuator 9 is driven upward in the Z-direction. On the other hand, as illustrated in FIG. 5B, when the sectional shape of the third actuator 9 is a substantially trapezoidal shape whose width is narrowed toward the lower side in the Z-direction, the third actuator 9 is driven downward in the Z-direction. The third actuator 9 is not limited to above, and may be configured such that the thickness in the Z-direction is not uniform. For example, the third actuator 9 may have a portion with an asymmetric thickness in the Z-direction.

For driving the member in the Z-direction crossing the upper surface of the substrate 200 by means of the MEMS element, a capacitance element having a comb electrode and a piezoelectric element has typically needed to be used, or a complicated hinge shape has typically needed to be used. According to the configuration of the present embodiment, the device layer of the substrate 200 is processed so that the third actuator 9 drivable in the Z-direction can be easily obtained. Moreover, as described later, the first and second actuators 3, 4 drivable in the X-direction and the third actuator 9 drivable in the Z-direction can be simultaneously formed by the same manufacturing steps.

Note that FIGS. 3A and 3B illustrate the configuration in which the intermediate portion 9*a* of the third actuator 9 is positioned at the center between both end portions 9*b*, 9*c*, but the present technique is not limited to such a configuration. The intermediate portion 9*a* may be closer to either one of the end portions 9*b*, 9*c*. The same applies to the configuration illustrated in FIG. 4.

[Shutter Apparatus Manufacturing Method]

Figure 6:
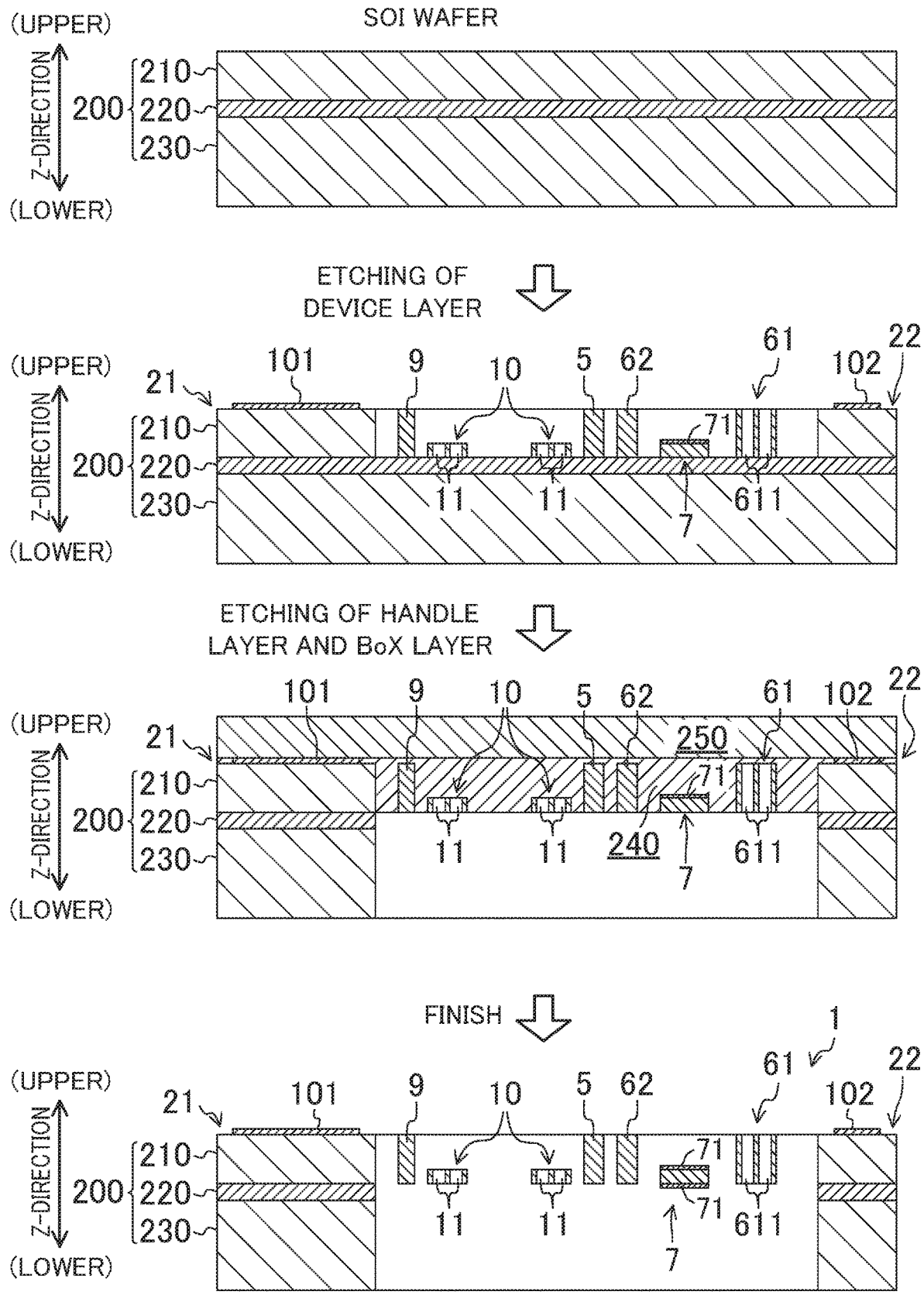
FIG. 6 is a view of the steps of manufacturing the shutter apparatus in the first embodiment.
Figure 7:
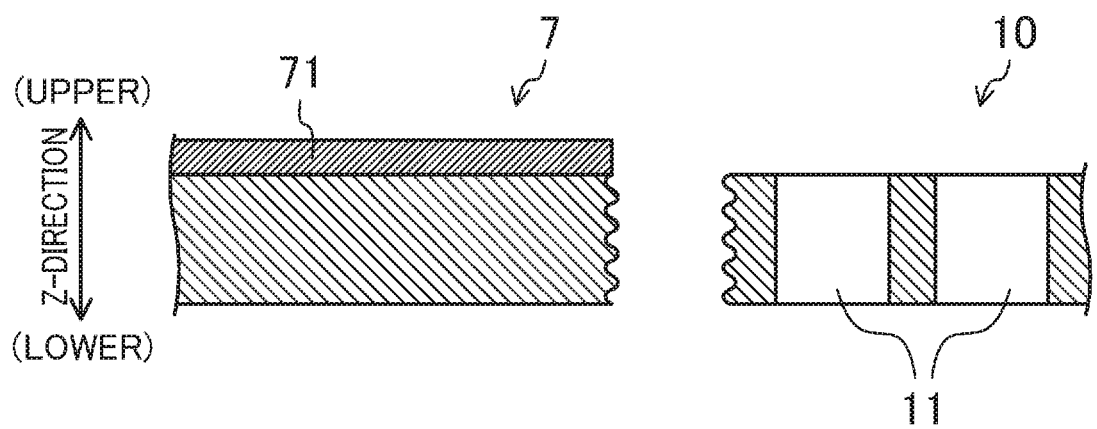
FIG. 7 is a partially-enlarged sectional view of a restriction member and a drive target member.

Subsequently, the method for manufacturing the shutter apparatus 1 will be described. FIG. 6 illustrates the steps of manufacturing the shutter apparatus 1 according to the present embodiment, and FIG. 7 is a partially-enlarged sectional view of the drive target member 7 and the restriction member 10 of FIG. 6. Note that each manufacturing step view illustrated in FIG. 6 corresponds to the sectional view along the II-II line of FIG. 1. Moreover, in FIG. 7, other members than the drive target member 7 and the restriction member 10 are not shown.

First, a SOI wafer (the SOI substrate 200) including the device layer (the first silicon layer 210), the Box layer (the oxide layer 220), and the handle layer (the second silicon layer 230) is prepared. For example, the thickness of the device layer is 30 μm, the thickness of the Box layer is 1 μm, and the thickness of the handle layer is 250 μm.

The device layer is etched to integrally form, in the device layer, the MEMS element including the fixing portion 2, the first and second actuators 3, 4 (not shown), the first beam 5, the second beam 6, the drive target member 7, the coupling member 8 (not shown), the third actuator 9, and the restriction member 10. Note that for the sake of convenience, only part of the MEMS element is illustrated in FIG. 6. Moreover, the lightening portions (holes) 611 provided at the second beam 6 and the lightening portions (holes) 11 provided at the restriction member 10 are formed at the same time as etching of the device layer.

Particularly, the number of times of etching for the drive target member 7 and the restriction member 10 is increased by one as compared to that for other members, and the drive target member 7 and the restriction member 10 are thinly formed with a thickness of about 7 μm. That is, the thicknesses of the drive target member 7 and the restriction member 10 are smaller than those of the first actuator 3, the second actuator 4, the third actuator 9, the first beam 5, and the second beam 6. Further, the first electrode 101 is formed on the front surface of the first base member 21, the second electrode 102 is formed on the front surface of the second base member 22, the third electrode 103 (not shown) is formed on the front surface of the third base member 23 (not shown), and the metal film 71 is formed on the front surface of the drive target member 7. The electrodes 101 to 103 are, for example, Au/Ti films having a Ti thickness of 20 nm and an Au thickness of 300 nm, and the metal film 71 is, for example, an Au/Pt/Ti film having a Ti thickness of 20 nm, a Pt thickness of 10 nm, and an Au thickness of 300 nm.

When the original shape of the shutter apparatus 1 is formed in the device layer, a dummy wafer 250 is subsequently bonded to the device layer with wax 240, and back layers, i.e., the Box layer and the handle layer, of the shutter apparatus 1 are etched. By such etching, the SOI substrate 200 remains in the fixing portion 2, and only the device layer remains in the first and second actuators 3, 4 (not shown), the first beam 5, the second beam 6, the drive target member 7, the coupling member 8 (not shown), the third actuator 9, and the restriction member 10 as other movable members of the MEMS element. Subsequently, e.g., the metal film 71 having the same multilayer structure and the same film thickness as those of the metal film 71 on the front surface is formed on the back surface of the drive target member 7.

Finally, the wax 240 and the dummy wafer 250 are removed to bring the shutter apparatus 1 to completion.

Note that when, e.g., a BOSCH method is used in etching of the device layer, a recessed-raised portion is formed at a side surface of each member as illustrated in FIG. 7. As described later, such a recessed-raised portion contributes to holding of displacement of the drive target member 7. Note that the method for providing the recessed-raised portions at the side surfaces of the drive target member 7 etc. is not limited to the BOSCH method, and other methods such as combination use of dry etching and wet etching may be employed. Depending on, e.g., restoring force of the first beam 5 and the second member 62 of the second beam 6 as described later and the thicknesses of the drive target member 7 and the restriction member 10, the recessed-raised portion is not necessarily provided at the side surface of each member.

Moreover, the third actuator 9 in the shape illustrated in FIG. 5A is obtained in such a manner that only the third actuator 9 is separately processed upon etching of the device layer or forward tapered etching is performed for the device layer itself. The third actuator 9 in the shape illustrated in FIGS. 4 and 5B is obtained in such a manner that only the third actuator 9 is separately processed from below after the Box layer and the handle layer have been etched.

[Operation of Shutter Apparatus]

Subsequently, operation of the shutter apparatus 1 configured as described above will be described with reference to FIGS. 8A to 8E. FIGS. 8A to 8E are views of a change in the drive voltage of the shutter apparatus 1 and arrangement of each member in association with such a change, and illustrate member arrangement corresponding to the section along the II-II line in FIG. 1. Note that for the sake of easy description of operation, the first beam 5 and the second member 62 of the second beam 6 are not shown in FIG. 2, as necessary.

FIG. 8A illustrates the shutter apparatus 1 before drive, and corresponds to a configuration indicated by a solid line of FIG. 1. $V_S$ indicates a voltage between the first electrode 101 and the second electrode 102, and a predetermined voltage is applied to the second electrode 102 to drive the first and second actuators 3, 4. Further, the drive target member 7 is displaced through the first and second beams 5, 6. $V_L$ indicates a voltage between the first electrode 101 and the third electrode 103, and a predetermined voltage is applied to the third electrode 103 to drive the third actuator 9 and displace the restriction member 10. Note that the first electrode 101 is fixed to a predetermined potential, i.e., a GND potential in this case, and is a GND electrode common to the second and third electrodes 102, 103.

The state of the shutter apparatus 1 before drive corresponds to a period I illustrated in FIG. 8A, and both of $V_S$ and $V_L$ are zero. Moreover, the position of the drive target member 7 in the period I is an initial position, and the drive target member 7 and the restriction member 10 are at the same position as viewed in the Z-direction, i.e., in the same plane. Further, the drive target member 7 is positioned between the initial position of the drive target member 7 and the target position (see FIG. 8C) as viewed in the Z-direction.

Next, when the predetermined voltage is applied to the third electrode 103, current flows in the third actuator 9, and due to generated Joule heat, the temperature of the third actuator 9 increases to 400° C. to 500° C. In association with such a temperature increase, the third actuator 9 thermally expands, and as described above, the intermediate portion 9a is driven upward in the Z-direction. At the same time, the restriction member 10 coupled to the intermediate portion 9a is displaced upward in the Z-direction. Note that, e.g., the length of the third actuator 9 and the amount of current flowing in the third actuator 9 are set in advance such that the amount of displacement of the intermediate portion 9a is greater than the thickness of the drive target member 7 (FIG. 8B (a period II)). That is, the restriction member 10 moves to the outside of a movement plane of the drive target member 7.

In a state in which the voltage is applied to the third electrode 103, when the predetermined voltage is further applied to the second electrode 102, current also flows in the first and second actuators 3, 4 electrically connected to the first electrode 101 and the second electrode 102, and due to generated Joule heat, each of the temperatures of the first and second actuators 3, 4 increases to 400° C. to 500° C. In association with such a temperature increase, the first and second actuators 3, 4 thermally expand. The first actuator 3 whose both end portions 3b, 3c are fixed to the fixing portion 2 are pushed leftward in the X-direction as a direction in which the intermediate portion 3a of the first actuator 3 protrudes in advance. Moreover, the second actuator 4 whose both end portions 4b, 4c are fixed to the fixing portion 2 are pushed rightward in the X-direction as a direction in which the intermediate portion 4a of the second actuator 4 protrudes in advance.

When the intermediate portion 3a of the first actuator 3 is pushed leftward in the X-direction, the first beam 5 coupled thereto is entirely pulled leftward in the X-direction. Moreover, when the intermediate portion 4a of the second actuator 4 is pushed rightward in the X-direction, the second beam 6 coupled thereto is entirely pulled rightward in the X-direction.

That is, the relative positions of the first end portion 5a of the first beam 5 and the second end portion 6c of the second beam 6 are changed in a direction in which the first end portion 5a and the second end portion 6c are separated from each other.

Even when the second beam 6 is entirely pulled rightward in the X-direction, almost no elastic deformation of the first member 61 of the second beam 6 is caused, and almost all of pull force by the second beam 6 is concentrated on the end portion 6a and is changed into the force of pushing the second member 62 rightward in the X-direction. Of the first beam 5 and the second member 62 of the second beam 6 arranged in parallel, the first beam 5 is, as a result, pulled leftward in the X-direction, and the second member 62 of the second beam 6 is pushed rightward in the X-direction. Thus, the second end portion 5b of the first beam 5 and the second end portion 6c of the second beam 6 are driven diagonally to the upper left side on the XY plane, and the first beam 5 and the second member 62 of the second beam 6 are greatly curved or bent with different curvatures. Accordingly, the second end portion 6c of the second beam 6 pushes the drive target member 7, and on the other hand, the second end portion 5b of the first beam 5 pulls the drive target member 7. Thus, the first member 61 of the second beam 6 slightly rotates counterclockwise about the first end portion 6b on the XY plane, and the drive target member 7 is pushed to a predetermined position, i.e., the target position, on the XY plane as illustrated in FIG. 8C. As described above, the restriction member 10 is displaced greater in the Z-direction than the thickness of the drive target member 7, and therefore, does not interfere with movement of the drive target member 7 (FIG. 8C (a period III)). Note that in the present embodiment, the second actuator 4 is configured such that the multiple actuators are coupled to each other, and therefore, as compared to the case of forming the second actuator 4 by a single actuator, rotational stiffness of counterclockwise rotation of the first member 61 of the second beam 6 about the first end portion 6b on the XY plane can be enhanced.

In a state in which the voltage is applied to the second electrode 102, when voltage application to the third electrode 103 is stopped, the current no longer flows in the third actuator 9, and the temperature of the third actuator 9 decreases. In association with such a temperature decrease, the third actuator 9 tends to return to the original length, and as described above, the intermediate portion 9a of the third actuator 9 is pulled back to the lower side in the Z-direction. In association with such displacement, the restriction member 10 also returns to an original position illustrated in FIG. 8A (FIG. 8D (a period IV)).

Subsequently, when voltage application to the second electrode 102 is also stopped, the current no longer flows in the first and second actuators 3, 4, and the temperatures of the first and second actuators 3, 4 decrease. In association with such a temperature decrease, the first and second actuators 3, 4 tend to return to original lengths. The intermediate portion 3a of the first actuator 3 pushed leftward in the X-direction is pulled back to the right side in the X-direction, and the intermediate portion 4a of the second actuator 4 pushed rightward in the X-direction is pulled back to the left side in the X-direction.

When the intermediate portion 3a of the first actuator 3 is pulled back to the right side in the X-direction, the first beam 5 coupled thereto is entirely pulled back to the right side in the X-direction. Moreover, when the intermediate portion 4a of the second actuator 4 is pulled back to the left side in the X-direction, the second beam 6 coupled thereto is entirely pulled back to the left side in the X-direction.

That is, the relative positions of the second end portion 5b of the first beam 5 and the second end portion 6c of the second beam 6 are changed in a direction in which the second end portion 5b and the second end portion 6c approach each other.

Even when the second beam 6 is entirely pulled back to the left side in the X-direction, almost no elastic deformation of the first member 61 of the fixing portion 2 is caused, and almost all of the pull force by the second beam 6 is concentrated on the end portion and is changed into the force of pulling the second member 62 leftward in the X-direction. Of the first beam 5 and the second member 62 of the second beam 6 arranged in parallel, the first beam 5 is, as a result, pushed rightward in the X-direction, and the second member 62 of the second beam 6 is pulled leftward in the X-direction. Thus, the second end portion 5b of the first beam 5 and the second end portion 6c of the second beam 6 are pushed back diagonally to the lower right side on the XY plane. The curved or bent first beam 5 and the curved or bent second member 62 of the second beam 6 tend to return to original substantially-straight shapes, and the drive target member 7 tends to return to the initial position on the XY plane as illustrated in FIG. 8A.

However, at this point of time, the restriction member 10 has been already present in the vicinity of the target position. Thus, the drive target member 7 comes into contact with an inner edge of the restriction member 10, and movement of the drive target member 7 is restricted. As indicated by chain double-dashed line in FIG. 1, displacement of the drive target member 7 is held. Moreover, the first beam 5 and the second member 62 of the second beam 6 fail to return to original states, and as indicated by the chain double-dashed line in FIG. 1, the first beam 5 and the second member 62 contact each other while the positions and shapes thereof are held in a curved or bent state (FIG. 8E (a period V)).

At this point, the drive target member 7 is biased to the inner edge of the restriction member 10 by the restoring force of returning the first beam 5 and the second member 62 of the second beam 6 to the original states. Moreover, as illustrated in FIG. 7, the recessed-raised portions are provided at the side surfaces of the drive target member 7 and the restriction member 10. Thus, due to the above-described restoring force and friction force generated by the recessed-raised portions provided at the side surfaces of both components, the drive target member 7 and the restriction member 10 are fixed not to move in different directions. For example, even in a case where external vibration is applied to the shutter apparatus 1, the drive target member 7 does not move apart from the restriction member 10 in the XY plane or the Z-direction.

Moreover, the positions of the first beam 5 and the second member 62 of the second beam 6 are held with the first beam 5 and the second member 62 contacting each other. In this state, when the temperature of either one of the first beam 5 or the second member 62 of the second beam 6 is, for example, higher than those of other members, heat is dissipated from a contact portion to other members, and as a result, heat is dissipated from both of the first beam 5 and the second member 62 of the second beam 6. Thus, the amount of heat propagating to the drive target member 7 is reduced, and an increase in the temperature of the drive target member 7 is suppressed. When the temperature of the drive target member 7 exceeds 200° C., silicon is diffused from the drive target member 7 having the first silicon layer 210 into the metal films 71, and optical characteristics of the drive target member 7 including the metal films 71 might be changed. For example, there is a probability that degradation of performance of the shutter apparatus 1 such as unavailability in light blocking is caused. Both of the first beam 5 and the second member 62 of the second beam 6 function as heat dissipation portions as described above. Thus, diffusion of the silicon from the drive target member 7 into the metal films 71 can be prevented, and therefore, the performance of the shutter apparatus 1 can be maintained.

Figure 8B:
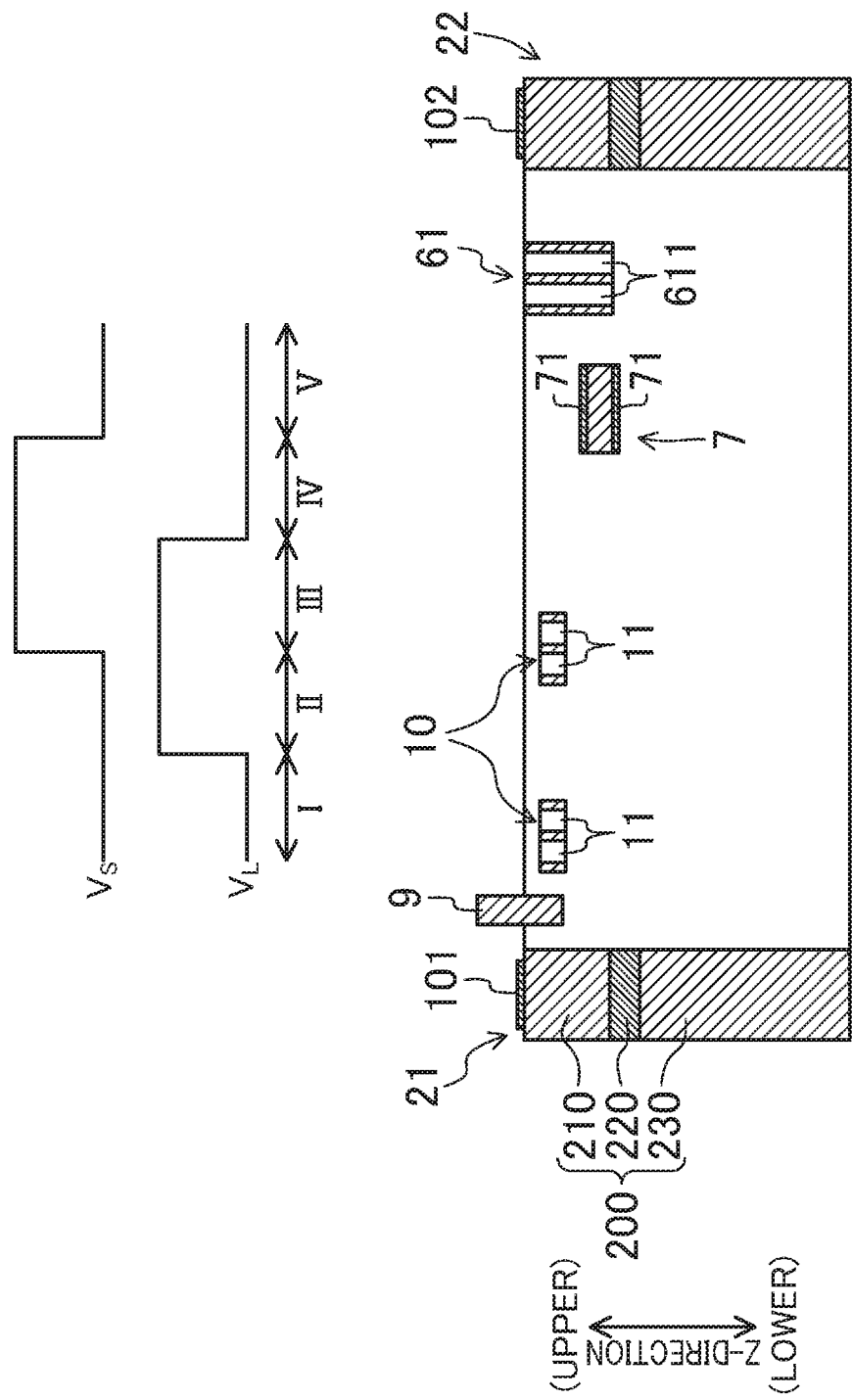
FIG. 8B is a view of a change in the drive voltage of the shutter apparatus according to the first embodiment and arrangement of each member in association with such a change.
Figure 8D:
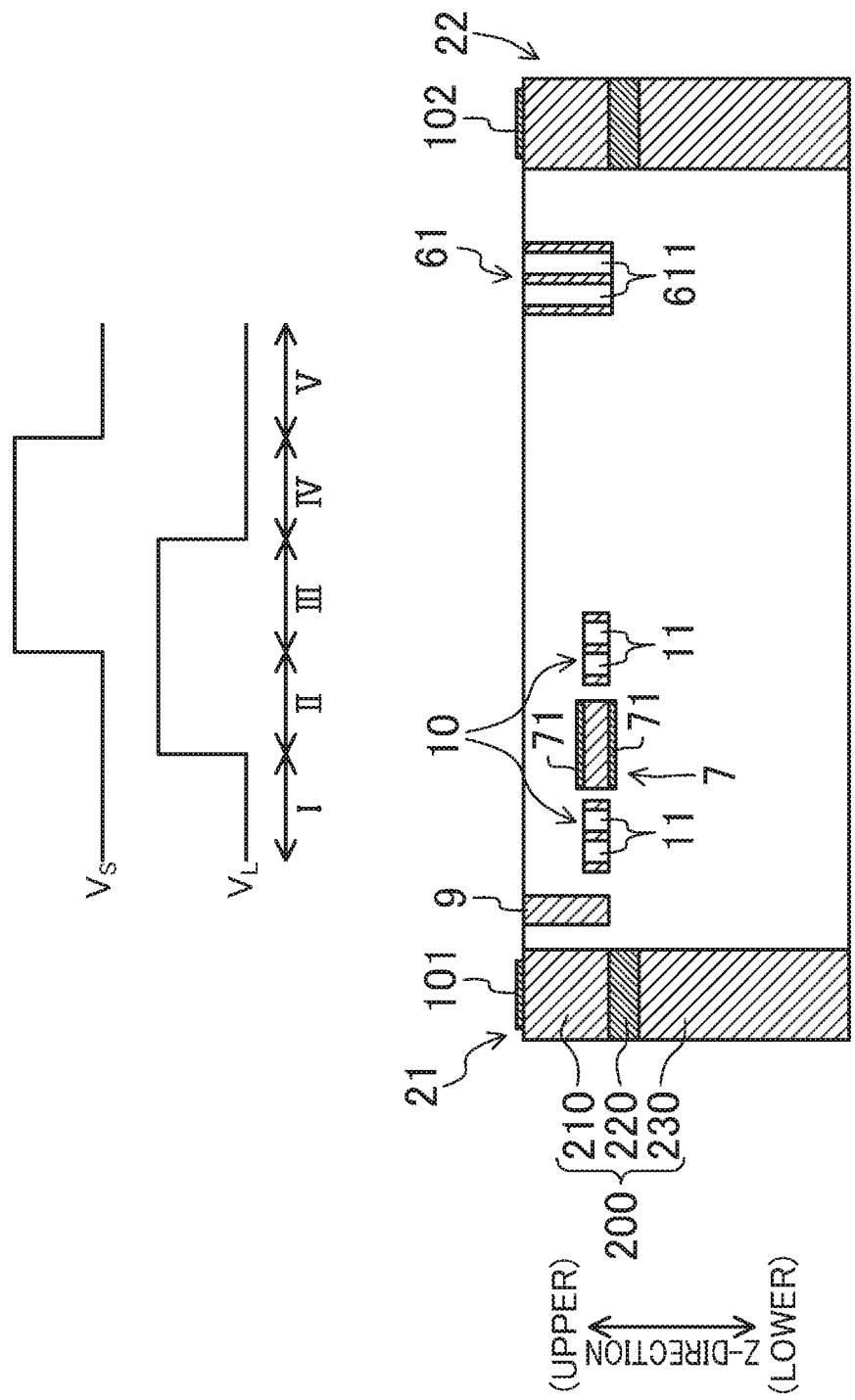
FIG. 8D is a view of a change in the drive voltage of the shutter apparatus according to the first embodiment and arrangement of each member in association with such a change.

Subsequently, the first and second actuators 3, 4 are driven to move the drive target member 7 to the target position on the XY plane as illustrated in FIG. 8C, thereby canceling a contact state between the drive target member 7 and the restriction member 10. Subsequently, the third actuator 9 is driven to displace the restriction member 10 upward in the Z-direction. The position of the restriction member 10 at this point is similar to that illustrated in FIGS. 8B and 8C. Further, drive of the first and second actuators 3, 4 is canceled, and accordingly, the drive target member 7 is moved to the initial position on the XY plane as illustrated in FIG. 8A. Finally, drive of the third actuator 9 is canceled, and accordingly, the restriction member 10 is moved to an original position illustrated in FIG. 8A.

As described above, voltage application to the second electrode 102 and cancellation of such application are switched to switch the position of the drive target member 7 on the XY plane as indicated by FIGS. 8A to 8E or the solid line and the chain double-dashed line of FIG. 1. The not-shown optical path is arranged to overlap with the drive target member 7 indicated by the solid line or the chain double-dashed line of FIG. 1. The position of the drive target member 7 is switched as illustrated in FIGS. 8A to 8E such that the drive target member 7 functions as the shutter configured to close or open the not-shown optical path. The drive target member 7 may close the not-shown optical path at the position before drive, and may open the optical path at a drive position. Conversely, the drive target member 7 may open the not-shown optical path in a state in which the drive target member 7 is not driven by the first actuator 3 and the second actuator 4, and may close the optical path at the drive position.

Note that in the present embodiment, the configuration of the thermal actuator configured to drive the drive target member 7 by thermal expansion of the components has been described as an example of the first and second actuators 3, 4, but a capacitance drive method or a piezoelectric drive method may be employed other than the thermal method. Moreover, the shutter is a concept including not only closing/opening of the optical path but also closing/opening of part of the optical path.

Advantageous Effects

According to the above-described MEMS element, the first and second actuators 3, 4 thermally expands by heating by power distribution, and in this manner, the first and second beams 5, 6 are driven to drive the drive target member 7 coupled to these two beams 5, 6. That is, the driven force of the first beam 5 and the second beam 6 driven by the first actuator 3 and the second actuator 4 is combined to drive the drive target member 7. Thus, the drive target member 7 can be greatly displaced by slight displacement of the first actuator 3 and the second actuator 4 as drive members.

Moreover, it is configured such that the third actuator 9 is driven in a direction crossing the surface of the drive target member 7. Thus, the restriction member 10 coupled to the third actuator 9 is driven in the Z-direction, and therefore, can be moved to the outside of the movement plane of the drive target member 7. The timing of moving the drive target member 7 in the XY plane and the timing of moving the restriction member 10 in the Z-direction are adjusted so that after the drive target member 7 has been displaced by a necessary amount, the drive target member 7 can come into contact with and press the restriction member 10 to restrict movement of the drive target member 7. Thus, displacement of the drive target member 7 can be held. Moreover, the third actuator 9 is in such a shape that the third actuator 9 is displaced in the Z-direction by thermal expansion by heating, and therefore, the amount of drive of the third actuator 9 can be increased with a low drive voltage. Further, by the restoring force of returning, due to natural cooling, the first and second beams 5, 6 coupled to the drive target member 7 to original lengths, the drive target member 7 is biased to the restriction member 10. Thus, displacement of the drive target member 7 can be held with no power supply without the need for separately supplying energy for holding displacement of the drive target member 7. With this configuration, time in which the first to third actuators 3, 4, 9 and the first and second beams 5, 6 are in a high-temperature state can be shortened, and e.g., deterioration of a portion with weak mechanical strength can be reduced. Thus, reliability of the MEMS element and the shutter apparatus 1 can be improved. Moreover, by the above-described restoring force, biasing of the drive target member 7 to the restriction member 10 is strengthened. Thus, even in a case where the external vibration is, for example, applied to the shutter apparatus 1, the drive target member 7 does not move apart from the restriction member 10 in the XY plane or the Z-direction. Further, the first to third actuators 3, 4, 9 are configured as the thermal actuators as described above, and therefore, the drive amounts thereof can be increased. That is, a necessary drive amount can be obtained even with a low voltage, and power consumption upon drive can be decreased.

Moreover, according to the above-described shutter apparatus 1, a great amount of displacement of the drive target member 7 functioning as the shutter is obtained, and therefore, the drive target member 7 can be sufficiently displaced even when the voltage applied to between the first electrode 101 and the second electrode 102 is low. Further, the third actuator 9 for drive in the direction crossing the surface of the drive target member 7 is provided, and the restriction member 10 is coupled to the third actuator 9. Thus, the restriction member 10 can be moved to the outside of the movement plane of the drive target member 7. In addition, displacement of the drive target member 7 can be held with no power supply, and therefore, power consumption can be decreased. Moreover, displacement of the shutter can be firmly held, and therefore, even in a case where the external vibration is applied to the shutter apparatus 1, favorable performance of the shutter apparatus 1 can be realized without leakage of part of blocked light or blocking of part of the open optical path.

<<Variations>>

FIGS. 9A and 9B illustrate a position relationship between the drive target member 7 and the restriction member 10 according to variations before and after drive. The restriction member 10 illustrated in FIG. 9A has a substantially rectangular shape as viewed in plane, and the section of the restriction member 10 in the Z-direction is in a shape having a recessed portion 10a on the lower side. In the period IV illustrated in FIG. 8D, when the restriction member 10 illustrated in FIG. 9A is lowered to a position before drive, the restriction member 10 covers the drive target member 7 to cross the center of the drive target member 7 as viewed in plane. Moreover, the recessed portion 10a covers part of the outer edge of the drive target member 7 from above and the right and left sides in the X-direction, thereby restricting movement of the drive target member 7.

The restriction member 10 is in the shape illustrated in FIG. 9A so that the size of the restriction member 10 can be reduced as compared to the shape illustrated in FIG. 1 and the resonance frequency of the restriction member 10 can be increased. Moreover, the restriction member 10 covers part of the drive target member 7 from above, and therefore, upward displacement of the drive target member 7 is reduced even when the drive target member 7 is, for example, moved upward by the external vibration during a period in which displacement of the drive target member 7 is held.

On the other hand, the restriction member 10 illustrated in FIG. 9B has a substantially rectangular shape as viewed in plane, and the section of the restriction member 10 in the Z-direction is in a shape having multiple recessed portions 10a on the lower side. In the period IV illustrated in FIG. 8D, when the restriction member 10 illustrated in FIG. 9B is lowered to the position before drive, the first beam 5 and the second member 62 of the second beam 6 coupled to the drive target member 7 are sandwiched by the recessed portions 10a provided at the restriction member 10, and therefore, movement of these components is restricted. With this configuration, movement of the drive target member 7 is restricted.

With the shape of the restriction member 10 as illustrated in FIG. 9B, the size of the restriction member 10 can be further reduced as compared to the shapes illustrated in FIGS. 1 and 9A, and the resonance frequency of the restriction member 10 can be increased. Moreover, since the multiple recessed portions 10a are provided in a longitudinal direction of the restriction member 10, i.e., the Y-direction in this case, the holding positions of the first beam 5 and the second member 62 of the second beam 6 can be changed according to the arrangement positions of the recessed portions 10a. With this configuration, the holding position of the drive target member 7 can be changed. Moreover, part of the optical path may be closed and passage of light passing through the remaining optical path may be allowed, or part of the optical path may be opened and blocking of light passing through the remaining optical path may be allowed, for example. Note that in a case where it is not necessary to change the holding position of the drive target member 7, the single recessed portion 10a may be provided at the restriction member 10 illustrated in FIG. 9B.

Second Embodiment

Depending on the thickness of a drive target member 7 and the size of a shutter apparatus 1, the amount of displacement of a restriction member 10 might be further increased as compared to the configuration described in the first embodiment. However, there has been a typical problem that a configuration is complicated or enlarged for increasing the amount of displacement of a member in the Z-direction crossing an upper surface of a substrate 200. For this reason, in the present embodiment, a structure of a third actuator 9 for increasing the amount of displacement of the member in the Z-direction will be described.

Figure 10:
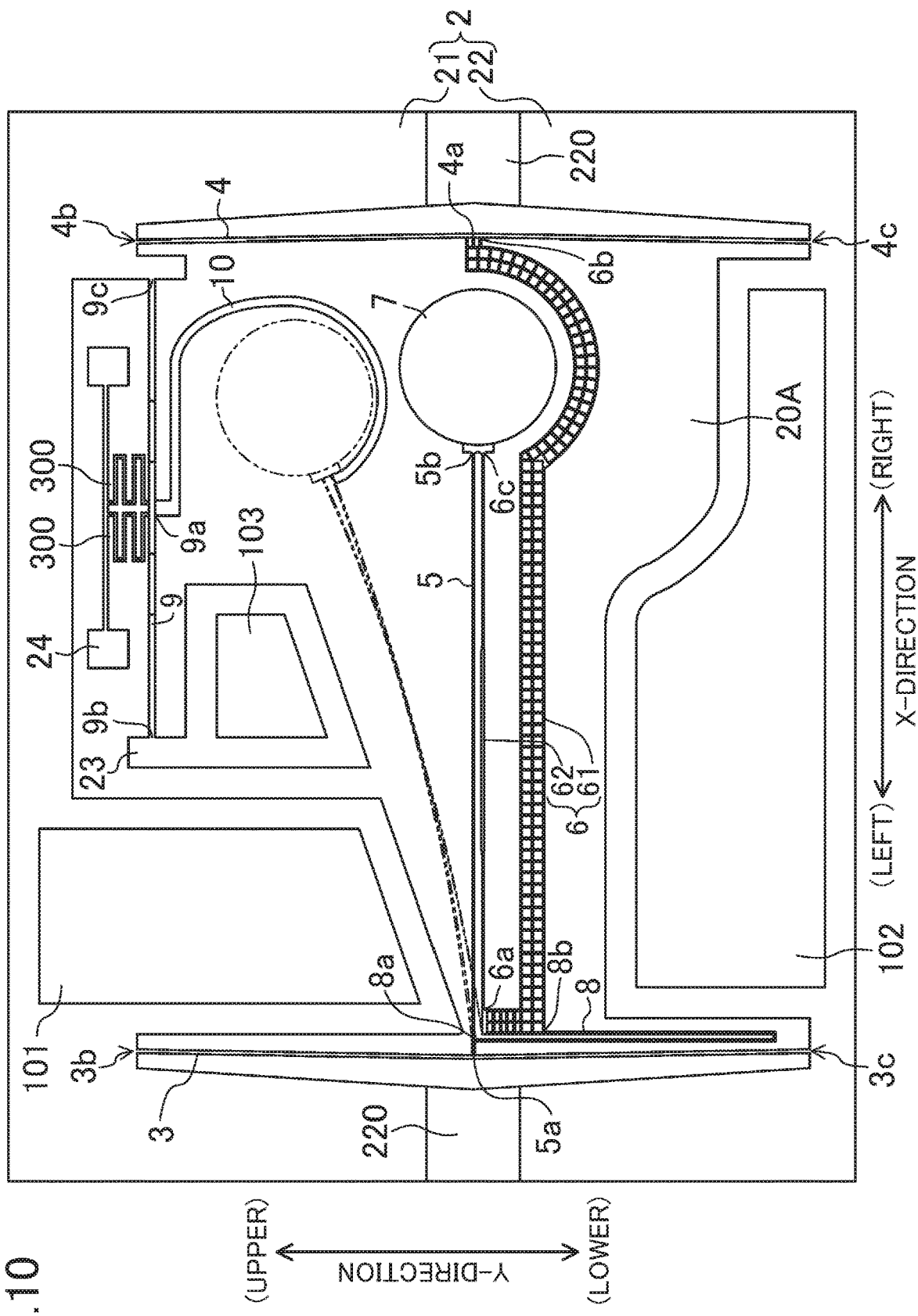
FIG. 10 is a plan view of a shutter apparatus according to a second embodiment.

FIG. 10 illustrates a plan view of the shutter apparatus 1 according to the present embodiment. Note that a chain double-dashed line in FIG. 10 indicates the shutter apparatus 1 in a state in which displacement of the drive target member 7 is held. Great differences between the shutter apparatus according to the present embodiment and the shutter apparatus configured as illustrated in FIG. 1 are that one end of hinges 300 is coupled to an intermediate portion 9a of the third actuator 9 and the other end of the hinges 300 is coupled to a fourth base member 24 provided at a fixing portion 2. Moreover, as viewed in the Y-direction, the hinges 300 are coupled to the third actuator 9 from the opposite side of the restriction member 10. With this configuration, the amount of displacement in the Z-direction at a portion of the restriction member 10 far from an end of the restriction member 10 coupled to the intermediate portion 9a can be increased.

FIGS. 11A and 11B illustrate a state before and after drive of the third actuator 9 and the restriction member 10. Note that in FIGS. 11A and 11B, only part of the restriction member 10 is illustrated. Moreover, the sizes of the third actuator 9 and the restriction member 10, a size relationship between the third actuator 9 and the restriction member 10, or a size relationship among the third actuator 9, the restriction member 10, and the hinge 300 is different from an actual size or size relationship in FIGS. 11A and 11B.

FIG. 11A corresponds to the configuration illustrated in FIG. 1, and the restriction member 10 is displaced upward in the Z-direction along with drive of the third actuator 9. On the other hand, FIG. 11B corresponds to the configuration illustrated in FIG. 10. In this case, when the third actuator 9 is driven to displace the intermediate portion 9a of the third actuator 9 upward in the Z-direction, the hinges 300 whose one end is coupled to the intermediate portion 9a are deformed to lift upward. At this point, the other end of the hinges 300 is coupled to the fourth base member 24, and therefore, the hinges 300 are deformed to incline diagonally upward in a YZ plane about a base point which is the end coupled to the fourth base member 24. In association with deformation of the hinges 300, the intermediate portion 9a of the third actuator 9 coupled thereto is also driven to incline diagonally upward in the YZ plane, and the restriction member 10 is also displaced to incline diagonally upward in the YZ plane. By such displacement, the portion of the restriction member 10 far from the end coupled to the intermediate portion 9a has the increased amount of displacement in the Z-direction as compared to the case of simple upward displacement in the Z-direction as illustrated in FIG. 11A. For example, the amount of displacement of the portion of the restriction member 10 far from the end coupled to the intermediate portion 9a in the Z-direction is, according to the configuration illustrated in FIG. 11B, equal to or greater than 1.5 times as much as that of the configuration illustrated in FIG. 11A. Thus, as compared to the configuration illustrated in FIG. 1, the same displacement amount can be, in the configuration illustrated in FIG. 10, obtained even with a smaller amount of current flowing in the third actuator 9. That is, the drive voltage of the third actuator 9 can be decreased, and power consumption necessary for drive of the third actuator 9 can be decreased.

Moreover, the fourth base member 24 coupled to the hinges 300 functions as a heatsink. Thus, upon cancelation of drive of the third actuator 9, the intermediate portion 9a is rapidly cooled, and the temperature thereof decreases. With this configuration, time in which the restriction member 10 coupled to the intermediate portion 9a returns to an original position is shortened, and the resonance frequency of the restriction member 10 is increased. Moreover, the amount of heat propagating to the restriction member 10 can be reduced, and therefore, an increase in the temperature of the drive target member 7 held by the restriction member 10 can be suppressed. With this configuration, diffusion of silicon from the drive target member 7 into metal films 71 can be prevented, and optical characteristics of the drive target member 7 including the metal films 71 and performance of the shutter apparatus 1 can be maintained. Note that, e.g., the number of times of folding-back of the hinge 300, the length and width of the hinge 300, and the number of hinges 300 coupled to the third actuator 9 may be changed as necessary according to, e.g., a required amount of displacement of the restriction member 10.

Third Embodiment

FIGS. 12A to 12C are views of a change in the drive voltage of a shutter apparatus 1 according to the present embodiment and arrangement of each member in association with such a change, and illustrate member arrangement corresponding to the section along the II-II line in FIG. 1. Note that for the sake of easy description of operation, a first beam 5 and a second member 62 of a second beam 6 are not shown in FIG. 2. Moreover, FIG. 12A corresponds to FIG. 8A, FIG. 12B corresponds to FIG. 8D, and FIG. 12C corresponds to FIG. 8E.

A difference between the configuration illustrated in FIGS. 8A to 8E and the configuration illustrated in FIGS. 12A to 12C is the thickness of a restriction member 10 in the Z-direction. For example, as illustrated in FIG. 12A, part of the restriction member 10, i.e., a lower surface of a portion closer to a third actuator 9 in this case, is not in the same plane as a lower surface of a drive target member 7, and is positioned lower than such a lower surface. Of a portion corresponding to the restriction member 10, a portion closer to the third actuator 9 partially remains upon etching of a Box layer and a handle layer, and therefore, the restriction member 10 in a shape illustrated in FIG. 12A can be obtained. Moreover, although not shown in the figure, a first silicon layer 210 of a portion corresponding to the drive target member 7 may be, upon etching of the Box layer and the handle layer, etched from below such that a bottom surface of the drive target member 7 is positioned higher than a bottom surface of the restriction member 10 in the Z-direction.

As illustrated in FIG. 12B (a period IV), when the drive target member 7 is moved in a XY plane by drive of first and second actuators 3, 4, the drive target member 7 moves to contact a portion of an inner edge of the restriction member 10 closer to the third actuator 9. Thereafter, as illustrated in FIG. 12C (a period V), drive of the third actuator 9 is canceled, and the restriction member 10 is lowered to a position before drive. At the same time, drive of the first and second actuators 3, 4 is canceled, and the drive target member 7 contacts a portion of the inner edge of the restriction member 10 far from the third actuator 9 to push the restriction member 10. Then, movement of the drive target member 7 is restricted, and such displacement is held.

When the drive target member 7 is moved by drive of the first and second actuators 3, 4 and is displaced to, e.g., a predetermined position illustrated in FIG. 8C, a phenomenon so-called ringing in which the drive target member 7 vibrates in the XY plane at the periphery of the predetermined position and such vibration is stopped while the amplitude of the vibration is being attenuated occurs due to, e.g., inertia moment applied to the drive target member 7 and stiffness of the first beam 5 and the second member 62 of the second beam 6. When such ringing is continued long, there is a probability that the drive target member 7 repeats reciprocation at the inner periphery of the restriction member 10 and one or both of the drive target member 7 and the restriction member 10 are damaged, for example. Moreover, in the case of the shutter apparatus 1 configured to block light with the drive target member 7 being displaced, light blocking performance is degraded.

On the other hand, the restriction member 10 has the shape illustrated in FIGS. 12A to 12C, and the drive target member 7 moves to contact the restriction member 10. Thus, the movement speed of the drive target member 7 can be decreased, and the above-described ringing can be reduced. With this configuration, e.g., damage of the drive target member 7 and the restriction member 10 can be prevented, and the life of the shutter apparatus 1 can be increased. Moreover, the light blocking performance of the shutter apparatus 1 can be maintained.

Note that for reducing ringing, a rise of a voltage $V_S$ applied to the first and second actuators 3, 4 may be rounded to prevent overshoot of the voltage $V_S$ or increase the voltage $V_S$ in a stepwise manner.

Fourth Embodiment

FIG. 13A illustrates a plan view of a shutter apparatus according to the present embodiment, FIG. 13B illustrates a plan view of another shutter apparatus, and FIG. 14 illustrates a plan view of a third beam. Note that in the present embodiment, the same reference numerals are used to represent elements similar to those of the first embodiment, and detailed description thereof will be omitted.

A difference among a configuration described in the present embodiment and the configurations described in the first to third embodiments is that a heat dissipation portion is provided at any of a first beam 5 and a second beam 6. For example, the heat dissipation portion is a protruding portion 50 illustrated in FIG. 13A, and the protruding portions 50 may be provided at the first beam 5. As illustrated in FIG. 13B, protruding portions 60 may be provided at a second member 62 of the second beam 6. In these cases, the multiple protruding portions 50, 60 are arranged at predetermined intervals along a longitudinal direction of the first beam 5 or a longitudinal direction of the second member 62 of the second beam 6, i.e., the X-direction. Moreover, the protruding portions 50 are formed to extend upward in the Y-direction, and the protruding portions 60 are formed to extend downward in the Y-direction. This is for preventing reduction in the amount of displacement of a drive target member 7 and damage of the first beam 5 and/or the second beam 6 due to contact of the protruding portions 50, 60 with the opposing beams 5, 6 when the first and second beams 5, 6 are driven. Note that when the second beam 6 is driven by a second actuator 4 as illustrated in FIG. 1, the second beam 6 rotates counterclockwise about the vicinity of an end portion 6a of a first member 61. Thus, in a case where the protruding portions 60 are formed to extend downward in the Y-direction, when the first and second beams 5, 6 are driven, tip ends of adjacent protruding portions 60 are displaced to open from each other. Thus, as described later, this is preferable in terms of reduction in heat dissipation and ringing of the drive target member 7.

Moreover, in a case where tip ends of the protruding portions 60 face the first member 61 of the second beam 6, when the first and second beams 5, 6 are driven, the length of the protruding portion 50 in the Y-direction needs to be adjusted such that the protruding portions 50 do not contact the first member 61. Note that in FIGS. 13A and 13B, the protruding portions 50, 60 are arranged in the vicinity of a second end portion 5b of the first beam 5 and a second end portion 6c of the second beam 6, but are not specifically limited to above. The protruding portions 50, 60 may be arranged in the vicinity of a first end portion 5a of the first beam 5 and an end portion 6a of the first member 61, or as viewed in the X-direction, may be arranged at a center portion of the first beam 5 and a center portion of the second member 62 of the second beam 6. Note that when the protruding portions 50 and/or the protruding portions 60 are arranged in the vicinity of the second end portion 5b of the first beam 5 and/or the second end portion 6c of the second beam 6, in a case where the drive target member 7 is, for example, irradiated with light, heat generated at the drive target member 7 due to light absorption can be promptly dissipated.

As described in the present embodiment, the protruding portions 50, 60 are provided at any of the first beam 5 and the second beam 6, and therefore, the surface area of each beam 5, 6 can be increased. Generally, a heat dissipation time constant upon heat dissipation of heat from an object is represented by Expression (1) below:

$$\tau c = mc/hA \qquad (1)$$

where τc: the heat dissipation time constant;
m: the mass of the object;
c: the specific heat of the object;
h: the heat transfer coefficient of the object; and
A: the surface area of the object.

As clearly seen from Expression (1), the surface area A of the object is increased, and in this manner, the heat dissipation time constant τc decreases. That is, heat is dissipated from the object within a shorter period of time. Thus, the protruding portions 50 and/or the protruding portions 60 are provided such that the heat dissipation time constant τc of the first beam 5 and/or the second beam 6 can be decreased as described in Expression (1), and therefore, the response speed of the drive target member 7 can be shortened. The response speed of the drive target member 7 corresponds to time until the drive target member 7 moves to a predetermined position after voltage has been applied to the first and second actuators 3, 4. In addition, heat transmitted from the first and second actuators 3, 4 to the first and second beams 5, 6 can be promptly dissipated from each beam 5, 6. Consequently, the amount of heat transfer to the drive target member 7 can be reduced, and an increase in the temperature of the drive target member 7 can be suppressed. Thus, diffusion of silicon forming the drive target member 7 into metal films 71 provided on both surfaces of the drive target member 7 can be prevented, and light blocking performance of the drive target member 7 as a shutter and the metal films 71 can be maintained. Moreover, the protruding portions 50, 60 are provided at the first beam 5 and/or the second beam 6, and therefore, braking force by air resistance is generated for ringing of the drive target member 7. Thus, ringing of the drive target member 7 can be settled, and light blocking/penetration performance can be maintained.

Note that the protruding portions 50, 60 extend in a direction parallel to an upper surface of a substrate 200, but may extend upward or downward in the Z-direction as a direction crossing the upper surface of the substrate 200 or extend in an upper-to-lower direction, for example. Moreover, the number of protruding portions 50, 60 is not specifically limited, and as necessary, is determined according to, e.g., required heat dissipation performance and ringing settlement time of the drive target member 7. Note that FIGS. 13A and 13B illustrate the configuration in which the protruding portions are provided only at the single beam, but the present technique is not specifically limited to above. The protruding portions can be provided at each of the multiple beams. The protruding portions 50, 60 may be provided at the first beam 5 and the second beam 6.

Fifth Embodiment

Figure 14A:
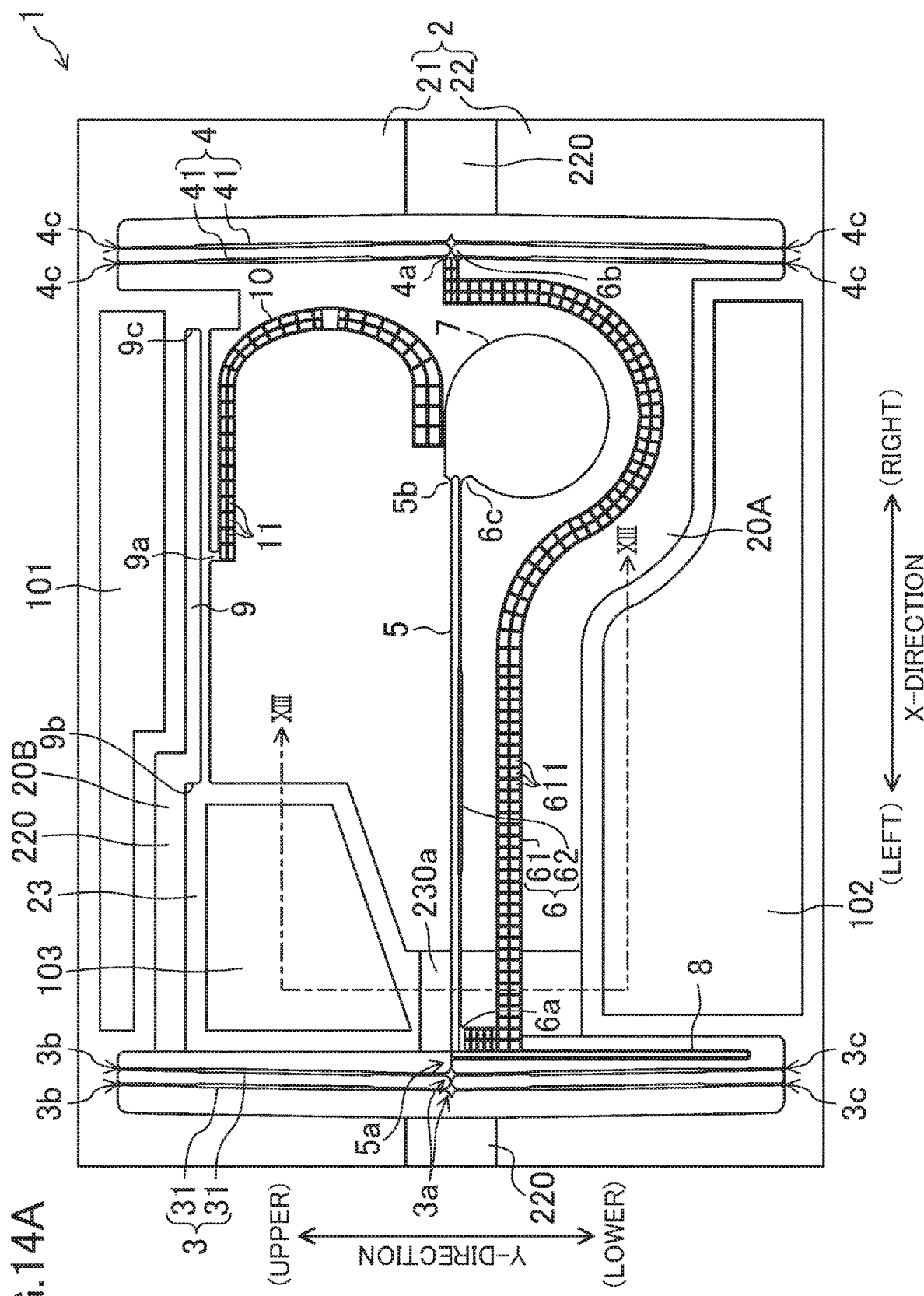
FIG. 14A is a plan view of a shutter apparatus according to a fifth embodiment.
Figure 14B:
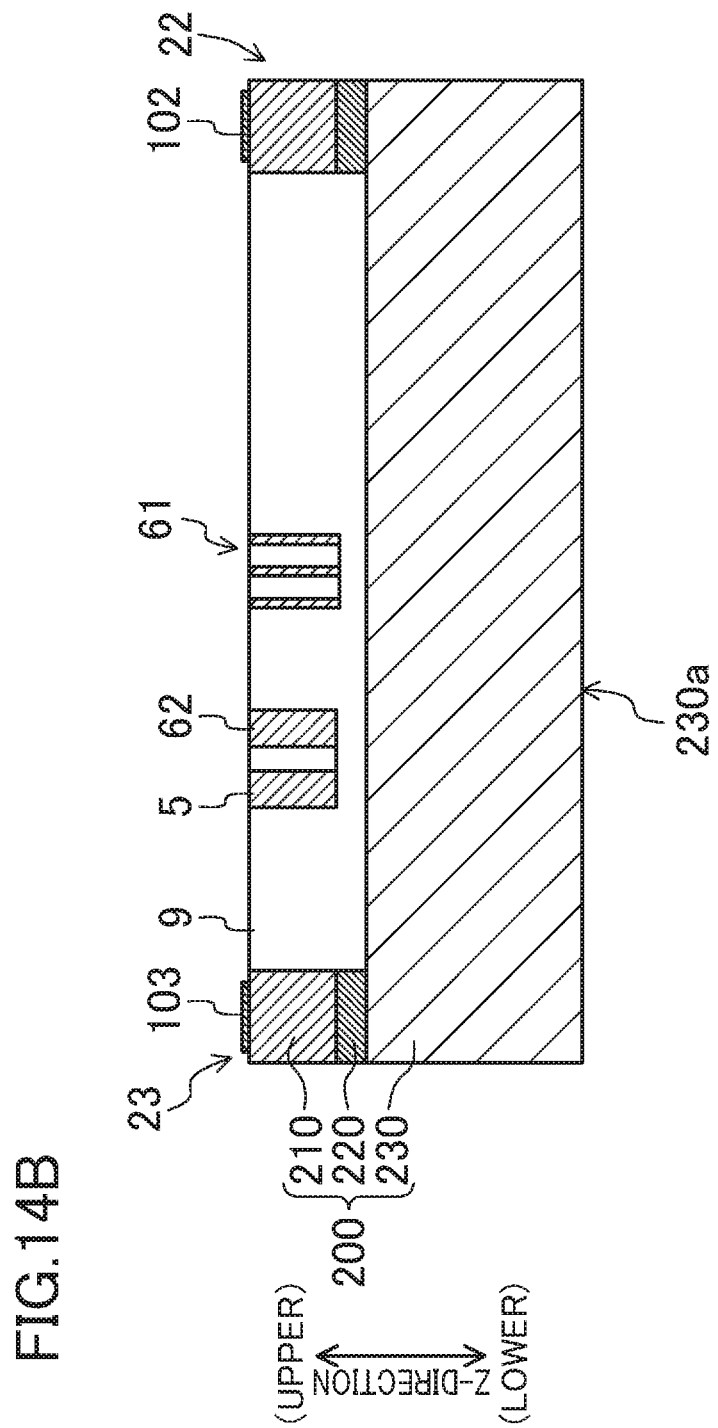
FIG. 14B is a sectional view along a XIVB-XIVB line of FIG. 14A.

FIG. 14A illustrates a plan view of a shutter apparatus according to the present embodiment, and FIG. 14B illustrates a sectional view along a XIVB-XIVB line of FIG. 14A. Moreover, FIG. 15 illustrates a plan view of another configuration of a heat dissipation portion illustrated in FIGS. 14A and 14B. Note that in the present embodiment, the same reference numerals are used to represent elements similar to those of the first embodiment, and detailed description thereof will be omitted. Moreover, FIG. 15 illustrates the plan view as viewed from the lower side in the Z-direction.

A difference among a configuration described in the present embodiment and the configurations described in the first to fourth embodiments is that a heat dissipation block 230a is provided with a predetermined spacing from beams 5, 6 on the lower side of the first beam 5 and the second beam 6 in the Z-direction. As illustrated in FIGS. 14A and 14B, the heat dissipation block 230a includes a second silicon layer 230 as a handle layer, and end portions of the heat dissipation block 230a in the Y-direction are coupled to a second silicon layer 230 of fixing portions 21, 22. Moreover, a Box layer 220 is interposed between the heat dissipation block 230a and a first electrode 101 and between the heat dissipation block 230a and a second electrode 102. Thus, the second silicon layer 230 is thermally joined to the first and second base members 21, 22, but is electrically insulated. Moreover, as illustrated in FIG. 14B, an interval between each of the first beam 5 and the second beam 6 and the heat dissipation block 230a corresponds to the thickness (1 μm) of the Box layer 220.

According to the present embodiment, heat transmitted to the first and second beams 5, 6 can be promptly dissipated through the heat dissipation block 230a. Generally, in a case where there is a temperature difference between two objects arranged in atmosphere and facing each other with a spacing, heat is exchanged between both objects through air. However, in the present embodiment, the interval between each of the first and second beams 5, 6 and the heat dissipation block 230a is a small interval of 1 μm. With the interval of this order, i.e., equal to or smaller than several μm, thermal resistance is small. Thus, heat is promptly dissipated from the first beam 5 and/or the second beam 6 to the heat dissipation block 230a. The heat dissipated to the heat dissipation block 230a is directly dissipated from the heat dissipation block 230a to the atmosphere, or is dissipated from the heat dissipation block 230a through the second silicon layer 230 of the first and second base members 21, 22. With this configuration, the amount of heat transfer to a drive target member 7 can be reduced, and an increase in the temperature of the drive target member 7 can be suppressed. Thus, diffusion of silicon forming the drive target member 7 into metal films 71 provided on surfaces of the drive target member 7 can be prevented, and light blocking performance of the drive target member 7 as a shutter and the metal film 71 can be maintained. Moreover, no oxide layer 220 as the Box layer is provided between each of the first and second beams 5, 6 and the heat dissipation block 230a, and therefore, movement of the first and second beams 5, 6 is not interfered. Note that FIGS. 14A and 14B illustrate the example where both end portions of the heat dissipation block 230a in the Y-direction are coupled to the first base member 21 and the second base member 22, but the heat dissipation block 230a may be coupled to any of the first base member 21 and the second base member 22.

The heat dissipation block 230a is formed in such a manner that at the step of etching back layers of a shutter apparatus 1 illustrated in FIG. 6, the second silicon layer 230 is etched using a not-shown mask such that the heat dissipation block 230a remains and the oxide layer 220 is removed by, e.g., etching using a hydrofluoric acid-based chemical, for example. However, a portion where the first and second beams 5, 6 and the heat dissipation block 230a overlap with each other as viewed in plane is about several hundreds of μm to several mm in the Y-direction. Thus, depending on the width of the overlapping portion in the X-direction, there is a probability that the amount of etching of the Box layer 220 increases and the first and second base members 21, 22 are deformed due to etching of the oxide layer 220 of the first and second base members 21, 22 from the side. Moreover, there is a probability that in wet etching using a chemical, fixation due to the surface tension of the member or electrostatic attractive force is caused.

For these reasons, as illustrated in FIG. 15, multiple lightening portions (holes) 231 are provided at the heat dissipation block 230a so that the above-described problems can be avoided. At the step of forming the heat dissipation block 230a, when the oxide layer 220 is removed, the chemical enters through the lightening portions 231, and therefore, the time of removing a portion of the oxide layer 220 contacting the heat dissipation block 230a is shortened. Thus, the amount of charge at the first and second beams 5, 6 and the heat dissipation block 230a can be reduced. Moreover, the lightening portions 231 are provided so that a facing area between each of the first and second beams 5, 6 and the heat dissipation block 230a can be decreased. Thus, fixation due to the surface tension or the electrostatic attractive force at the first and second beams 5, 6 and the heat dissipation block 230a can be reduced. With the above-described configuration, the surface tension or the electrostatic attractive force between the first beam 5 and/or the second beam 6 and the heat dissipation block 230a can be weakened to prevent fixation of these components or damage of the first beam 5 and/or the second beam 6. Moreover, the lightening portions 231 are provided so that the surface area of the heat dissipation block 230a can be increased and heat can be promptly dissipated from the heat dissipation block 230a. Note that the heat dissipation block 230a described in the present embodiment may be provided in each of the configurations described in the first to fifth embodiments. An increase in the temperature of the drive target member 7 can be suppressed, and the light blocking performance of the drive target member 7 as the shutter and the metal film 71 can be maintained. Note that in FIG. 14A, the heat dissipation block 230a is arranged on a side closer to a first end portion 5a of the first beam 5 or an end portion 6a of the second beam 6, but the present technique is not specifically limited to above. For example, in FIG. 14A, the heat dissipation block 230a may be arranged below a center portion of the first beam 5 or a center portion of a second member 62 of the second beam 6. In this case, e.g., the area of the heat dissipation block 230a arranged below a third actuator 9 needs to be adjusted such that predetermined heat dissipation or more from the third actuator 9 is not performed, i.e., the amount of drive of the third actuator 9 is not decreased by a predetermined amount or more.

Other Embodiments

Note that as illustrated in FIG. 10, each of the first actuator 3 and the second actuator 4 may include a single actuator. Moreover, the sizes and structures of the first actuator 3 and the second actuator 4 are not necessarily the same as each other, and may be different from each other. The number of actuators may be different between the first actuator 3 and the second actuator 4. For example, the first actuator 3 may include a single actuator, and the second actuator 4 may include two actuators. Moreover, the length of the member forming the first actuator 3 and the length of the member forming the second actuator 4 may be different from each other. Further, the actuator drive method may be different. For example, the first actuator 3 may employ the thermal drive method, and the second actuator 4 may employ the capacitance drive method. In addition, only either one of the first actuator 3 or the second actuator 4 may be driven to drive the drive target member 7. Moreover, either one of the first actuator 3 or the second actuator 4 may be omitted. In all of the above-described embodiments including the variations, the above-described configurations may be applied to the corresponding members, as necessary.

Moreover, in all of the above-described embodiments including the variations, the configuration in which the restriction member 10 is displaced in the Z-direction and the drive target member 7 moves in the XY plane has been described. However, it may be configured such that the drive target member 7 is displaced in the Z-direction and the restriction member 10 moves in the XY plane, for example. In this case, the first and second actuators 3, 4 may be coupled to the restriction member 10, and the third actuator 9 may be coupled to the drive target member 7, for example. Particularly, when the third actuator 9 is the thermal actuator, the displacement amount can be increased as compared to the actuators employing the thermal drive method and the capacitance drive method. Moreover, the configuration in which the first beam 5 and the second member 62 of the second beam 6 contact each other with displacement of the drive target member 7 being held while the positions and shapes of the first beam 5 and the second member 62 are held in the curved or bent state has been described. However, depending on, e.g., the amount of displacement of the drive target member 7 and the lengths of the first beam 5 and the second member 62 of the second beam 6, both components do not necessarily contact each other. Note that in the above-described embodiments, the configuration of the thermal actuator configured to drive the drive target member 7 by thermal expansion of the components has been described as an example of the first, second, and third actuators 3, 4, 9. However, other methods than the thermal method, such as the capacitance drive method or the piezoelectric drive method may be employed. For example, the first and second actuators 3, 4 may be the thermal actuators, and the third actuator 9 may be the piezoelectric drive actuator. Various combinations can be applied. Note that the amount of drive of the actuator can be increased with a low voltage by means of the thermal actuator.

Note that the metal films 71 formed on both surfaces of the drive target member 7 may be Au/Ti films. Moreover, in the shutter apparatus 1, the metal film 71 can be formed only on any of the front and back surfaces of the drive target member 7. Further, as described in the second embodiment, when the third actuator 9 is coupled to the fourth base member 24 through the hinges 300, the drive target member 7 can be inclined in the direction crossing the surface of the drive target member 7 about the axis passing through the coupling end between each hinge 300 and the fourth base member 24, and the drive target member 7 can be utilized as a light reflective mirror. In this case, for more strongly preventing silicon diffusion, the metal films 71 formed on the surfaces of the drive target member 7 are preferably the above-described multilayer film of Au/Pt/Ti. Note that in a case where it is configured such that the drive target member 7 is displaced in the Z-direction and the restriction member 10 moves in the XY plane, the thickness of the restriction member 10 needs to be greater than the amount of displacement of the drive target member 7. Moreover, the present technique is not limited to above, and the components described in each of the above-described embodiments may be combined to form a new embodiment.

INDUSTRIAL APPLICABILITY

The technique disclosed herein is useful in application to an optical apparatus configured such that a drive direction of a first actuator configured to drive a drive target member crosses a drive direction of a third actuator configured to drive a restriction member configured to hold displacement of the drive target member, the optical apparatus being configured so that reduction in the size of the apparatus can be realized and excellent light blocking/penetration or reflection performance can be provided.

DESCRIPTION OF REFERENCE CHARACTERS

1 Shutter Apparatus
2 Fixing Portion
3 First Actuator
4 Second Actuator
5 First Beam
6 Second Beam
7 Drive Target Member
8 Coupling Member
9 Third Actuator
10 Restriction Member
50 Protruding Portion (Heat Dissipation Portion)
60 Protruding Portion (Heat Dissipation Portion)
101 First Electrode
102 Second Electrode
103 Third Electrode
200 SOI Substrate (Substrate)
210 First Silicon Layer (Device Layer)
220 Oxide layer (Box Layer)
230 Second Silicon Layer (Handle Layer)
230a Heat Dissipation Block

The invention claimed is:

1. A MEMS element comprising:
a substrate;
a fixing portion provided at the substrate;
a first actuator provided at the fixing portion;
a drive target member coupled to the first actuator;
a third actuator provided at the fixing portion; and
a restriction member coupled to the third actuator,
wherein the first actuator drives the drive target member in a direction parallel to or crossing an upper surface of the substrate, and
the third actuator drives the restriction member in a direction crossing a movement direction of the drive target member to position the restriction member within a movement plane of the drive target member such that the restriction member restricts displacement of the drive target member.

2. The MEMS element according to claim 1, wherein
the first actuator includes a first drive beam coupled to the fixing portion, and is driven by heating of the first drive beam,
the third actuator is coupled to the fixing portion, includes a third drive beam having different structures between a first surface and a second surface facing the first surface, and is driven by heating of the third drive beam,
the first actuator drives the drive target member in a direction parallel to an upper surface of the substrate, and
the third actuator drives the restriction member in a direction crossing the upper surface of the substrate to position the restriction member within a movement plane of the drive target member such that the restriction member restricts displacement of the drive target member.

3. The MEMS element according to claim 1, wherein
a tip end side of a first beam coupled to the fixing portion is folded back, and
the drive target member is coupled to a folded-back portion.

4. The MEMS element according to claim 1, wherein
the first actuator drives the drive target member from an initial position to a target position, and
the restriction member extends from the third actuator, and the third actuator moves, upon restriction of the drive target member, the restriction member between the initial position and the target position.

5. The MEMS element according to claim 1, wherein
the first actuator drives the drive target member from an initial position to a target position, and
the third actuator moves the restriction member on a plane identical to the movement plane of the drive target member upon restriction of the drive target member, and restricts drive of the drive target member in a vicinity of the target position.

6. The MEMS element according to claim 1, wherein
the drive target member is coupled to the fixing portion through a first beam,
the first actuator curves the first beam to drive the drive target member, and
displacement of the drive target member is restricted by the restriction member in a state in which the drive target member pushes the restriction member by restoring force accompanied by curving of the first beam.

7. The MEMS element according to claim 6, wherein
the first beam includes a heat dissipation portion extending in a direction crossing an extension direction of the first beam.

8. The MEMS element according to claim 6, wherein
a heat dissipation block is provided below the first beam with a predetermined spacing from the first beam.

9. The MEMS element according to claim 8, wherein
the substrate is configured such that a device layer, an oxide layer, and a handle layer are stacked in this order, and
the first beam includes the device layer, and the heat dissipation block includes the handle layer and is coupled to the fixing portion.

10. The MEMS element according to claim 1, wherein
the drive target member is coupled to the fixing portion through a second beam,
in a state before drive of the MEMS element, the restriction member is provided in a drive direction of the drive target member and the second beam is provided in an opposite direction of the drive direction of the drive target member, and
in a state after drive of the MEMS element, the restriction member restricts movement of the drive target member from both of the drive direction of the drive target member and the opposite direction of the drive direction of the drive target member.

11. The MEMS element according to claim 10, wherein the second beam includes a heat dissipation portion extending in a direction crossing an extension direction of the second beam.

12. The MEMS element according to claim 10, wherein a heat dissipation block is provided below the second beam with a predetermined spacing from the second beam.

13. The MEMS element according to claim 12, wherein the substrate is configured such that a device layer, an oxide layer, and a handle layer are stacked in this order, and the second beam includes the device layer, and the heat dissipation block includes the handle layer and is coupled to the fixing portion.

14. The MEMS element according to claim 1, wherein a recessed-raised portion is formed at a portion where the drive target member and the restriction member contact each other.

15. The MEMS element according to claim 1, wherein the third actuator is a thermal actuator to be driven by heating, and has a non-uniform thickness as viewed from a longitudinal direction or a transverse direction of the third actuator.

16. The MEMS element according to claim 1, wherein the third actuator is a thermal actuator to be driven by heating, and has a raised portion at either one of the first surface or the second surface parallel to the substrate.

17. The MEMS element according to claim 1, wherein at least one of electrodes connected to the first actuator and the third actuator is a common electrode.

18. An optical apparatus comprising:
the MEMS element according to claim 1;
a first electrode arranged on the fixing portion of the MEMS element and electrically connected to a first end portion of the first actuator and a first end portion of the third actuator in the MEMS element;
a second electrode arranged on the fixing portion of the MEMS element and electrically connected to a second end portion of the first actuator of the MEMS element; and
a third electrode electrically connected to a second end portion of the third actuator,
wherein an optical path is blocked or opened or light is reflected by the drive target member of the MEMS element.

19. A method for driving the MEMS element according to claim 1, comprising:
a restriction cancellation step of driving the third actuator to move the restriction member positioned in a plane identical to that of the drive target member to an outside of the identical plane;
a drive target member movement step of driving the first actuator to drive the drive target member from the initial position to the target position;
a first restriction step of canceling drive of the third actuator to move the restriction member to the plane identical to that of the drive target member; and
a second restriction step of canceling drive of the first actuator to cause the drive target member to contact the restriction member.

20. The MEMS element drive method according to claim 19, further comprising:
a second restriction cancellation step of driving the first actuator to move the drive target member from a state in which the drive target member contacts the restriction member to the target position;
a first restriction cancellation step of driving the third actuator to move the restriction member in the plane identical to that of the drive target member to the outside of the identical plane;
a drive target member position recovery step of canceling drive of the first actuator to move the drive target member from the target position to the initial position; and
an initialization step of canceling drive of the third actuator.

* * * * *